(12) United States Patent
Fukuzaki

(10) Patent No.: US 11,728,403 B2
(45) Date of Patent: Aug. 15, 2023

(54) SEMICONDUCTOR DEVICE

(71) Applicant: SONY SEMICONDUCTOR SOLUTIONS CORPORATION, Kanagawa (JP)

(72) Inventor: Yuzo Fukuzaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/409,293

(22) Filed: Aug. 23, 2021

(65) Prior Publication Data

US 2022/0045191 A1 Feb. 10, 2022

Related U.S. Application Data

(63) Continuation of application No. 16/964,230, filed as application No. PCT/JP2018/047706 on Dec. 26, 2018, now Pat. No. 11,133,396.

(30) Foreign Application Priority Data

Jan. 30, 2018 (JP) ................................. 2018-013471

(51) Int. Cl.
*H01L 29/51* (2006.01)
*H01L 29/10* (2006.01)
*H01L 29/06* (2006.01)

(52) U.S. Cl.
CPC ........ *H01L 29/511* (2013.01); *H01L 29/0669* (2013.01); *H01L 29/1033* (2013.01)

(58) Field of Classification Search
CPC . H01L 29/511; H01L 29/1033; H01L 29/0669
(Continued)

(56) References Cited

U.S. PATENT DOCUMENTS 7,700,416 B1 4/2010 Clifton et al.
9,515,138 B1 12/2016 Doris et al.
(Continued)

FOREIGN PATENT DOCUMENTS

JP S63-102264 5/1988
JP 2006352125 A 12/2006
(Continued)

OTHER PUBLICATIONS

International Search Report and Written Opinion for International (PCT) Patent Application No. PCT/JP2018/047706, dated Mar. 19, 2019.
(Continued)

*Primary Examiner* — Sheikh Maruf
(74) *Attorney, Agent, or Firm* — Sheridan Ross P.C.

(57) ABSTRACT

A semiconductor device includes a stacked structure having channel formation region layers $CH_1$ and $CH_2$, gate electrode layers $G_1$, $G_2$, and $G_3$ alternately arranged on a base, in which a lowermost layer of the stacked structure is formed with a $1^{st}$ layer $G_1$ of the gate electrode layers, an uppermost layer of the stacked structure is formed with an $N^{th}$ (where $N \geq 3$) layer $G_3$ of the gate electrode layers, the gate electrode layers each have a first end face, a second end face, a third end face opposing the first end face, and a fourth end face opposing the second end face, the first end face of odd-numbered layers $G_1$, $G_3$ of the gate electrode layers is connected to a first contact portion, and the third end face of an even-numbered layer $G_2$ of the gate electrode layers is connected to a second contact portion.

15 Claims, 33 Drawing Sheets

(58) Field of Classification Search
USPC .......................................................... 257/324
See application file for complete search history.

(56) References Cited

U.S. PATENT DOCUMENTS

| | | | |
|---|---|---|---|
| 10,229,971 | B1 | 3/2019 | Cheng et al. |
| 11,133,396 | B2 | 9/2021 | Fukuzaki |
| 2010/0240205 | A1 | 9/2010 | Son et al. |
| 2010/0295022 | A1 | 11/2010 | Chang et al. |
| 2011/0169067 | A1 | 7/2011 | Ernst et al. |
| 2012/0068150 | A1 | 3/2012 | Bangsaruntip et al. |
| 2012/0286350 | A1* | 11/2012 | Doris ............... H01L 29/66636 257/327 |
| 2013/0078777 | A1* | 3/2013 | Cheng ............... H01L 27/1203 438/291 |
| 2013/0181274 | A1 | 7/2013 | Saitoh et al. |
| 2013/0203248 | A1* | 8/2013 | Ernst ............... H01L 27/11578 438/530 |
| 2014/0110765 | A1* | 4/2014 | Murali ............... H01L 29/4966 257/288 |
| 2015/0123215 | A1* | 5/2015 | Obradovic ........ H01L 29/78681 257/410 |
| 2015/0243784 | A1 | 8/2015 | Morin |
| 2015/0340457 | A1* | 11/2015 | Xie ................... H01L 29/6681 257/288 |
| 2016/0079394 | A1* | 3/2016 | Li ....................... H01L 29/785 257/347 |
| 2016/0380104 | A1 | 12/2016 | Cohen et al. |
| 2017/0062598 | A1 | 3/2017 | Seo |
| 2017/0148787 | A1 | 5/2017 | Obradovic |
| 2017/0148922 | A1* | 5/2017 | Hatcher ............ H01L 29/66742 |
| 2017/0256609 | A1 | 9/2017 | Bhuwalka |
| 2017/0263728 | A1 | 9/2017 | Kittl et al. |
| 2017/0365661 | A1 | 12/2017 | Doris |

FOREIGN PATENT DOCUMENTS

| | | |
|---|---|---|
| JP | 2014505995 A | 3/2014 |
| JP | 5544715 B2 | 7/2014 |
| JP | 2015-195405 | 11/2015 |
| KR | 20170106172 A | 9/2017 |
| WO | WO-2008023776 A | 2/2008 |

OTHER PUBLICATIONS

Extended European Search Report for European Patent Application No. 18904413.4, dated Feb. 17, 2021, 8 pages.

Official Action for U.S. Appl. No. 16/964,230, dated Feb. 4, 2021, 8 pages.

Notice of Allowance for U.S. Appl. No. 16/964,230, dated May 28, 2021, 10 pages.

* cited by examiner

SEMICONDUCTOR DEVICE

CROSS REFERENCE TO RELATED APPLICATIONS

This application is a continuation of and claims priority to U.S. application Ser. No. 16/964,230, filed Jul. 23, 2020, which is a national stage application under 35 U.S.C. 371 and claims the benefit of PCT Application No. PCT/JP2018/047706 having an international filing date of Dec. 26, 2018, which designated the United States, which PCT application claimed the benefit of Japanese Patent Application No. 2018-013471, filed Jan. 30, 2018, the entire disclosures of each of which are incorporated herein by reference.

TECHNICAL FIELD

The present disclosure relates to a semiconductor device, and more specifically, to a field-effect transistor having the structure of nanowire or nanosheet.

BACKGROUND ART

The scaling trend of advanced MOS transistors from 2012 is described. The use of a bulk planar MOSFET is dominant in 20-nm technology generation. In 14-nm technology generation and later, the trend is going to move toward full employment of a Fin-structured FET (referred to as "Fin-FET" for convenience of description) or a FET having fully depleted-silicon on insulator (FD-SOI) structure (referred to as "FD-SOI-FET" for convenience of description). Although the thickness of a silicon layer that is closely related to the gate length scaling, that is, the thicknesses of the Fin structure in the Fin-FET or a silicon layer in the FD-SOI-FET is an important factor in the FET miniaturization, the silicon layer is considered to have a technical limit of 5-nm thickness.

A FET having nanowire structure (referred to as "nanowire FET" for convenience of description) can be mentioned as a technique for breaking through the limitation on the thickness of the silicon layer forming a channel formation region of FET as mentioned above (e.g., see Japanese Patent Application Laid-Open No. 2015-195405).

Applying, incidentally, a back bias to the channel formation region enables the performance to be improved in tune with the operation of the transistor, resulting in reducing leakage current. Specifically, in one example, applying $+V_{dd}$ to one of gate electrodes sandwiching the channel formation region and applying $+V_{dd}$ to the other of the gate electrodes sandwiching the channel formation region make it possible to improve the transistor drive capability. In addition, in one example, applying 0 volt to one of the gate electrodes sandwiching the channel formation region and applying $-V_{dd}$ to the other of the gate electrodes sandwiching the channel formation region make it possible to reduce the leakage current in the off state of the transistor.

CITATION LIST

Patent Document

Patent Document 1: Japanese Patent Application Laid-Open No. 2015-195405

SUMMARY OF THE INVENTION

Problems to be Solved by the Invention

The nanowire FET disclosed in Patent Document 1 mentioned above, however, fails to apply a back bias to the channel formation region because gate electrodes surround the periphery of the nanowire-structured channel formation region. In other words, the nanowire FET disclosed in Patent Document 1 mentioned above is incapable of reducing leakage current while improving the performance in tune with the operation of a transistor.

The present disclosure is thus intended to provide a semiconductor device that is capable of reducing leakage current while improving performance in tune with the operation of a transistor.

Solutions to Problems

A semiconductor device of the present disclosure for achieving the above-described object includes:

a stacked structure having a channel formation region layer and a gate electrode layer alternately arranged on top of each other on a base, in which a lowermost layer of the stacked structure is formed with a $1^{st}$ layer of the gate electrode layers, an uppermost layer of the stacked structure is formed with an $N^{th}$ (where N≥3) layer of the gate electrode layers, the gate electrode layers each have a first end face, a second end face, a third end face opposing the first end face, and a fourth end face opposing the second end face, the first end face of an odd-numbered layer of the gate electrode layers is connected to a first contact portion, and the third end face of an even-numbered layer of the gate electrode layers is connected to a second contact portion.

MODE FOR CARRYING OUT THE INVENTION

Figure 1A:
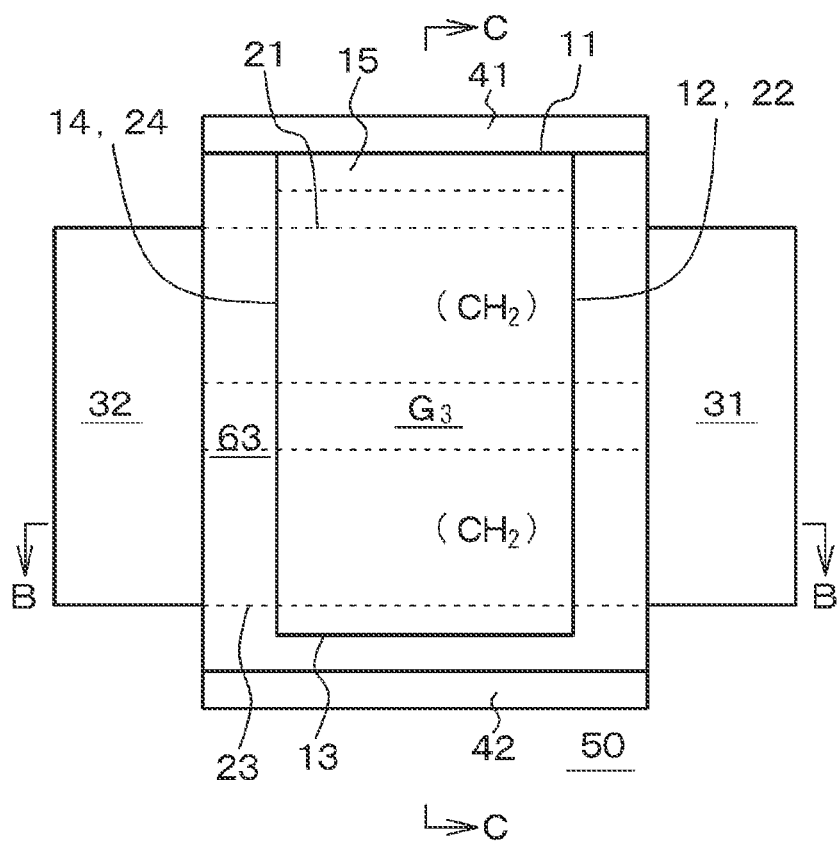
FIGS. 1A, 1B, and 1C are respectively a view when viewed from above a semiconductor device of a first embodiment, a schematic cross-sectional view taken along an arrow B-B in FIG. 1A, and a schematic cross-sectional view taken along an arrow C-C in FIG. 1A.

Hereinafter, the present disclosure will be described on the basis of embodiments with reference to the drawings, but the present disclosure is not limited to the embodiments, and the various numerical values and materials in the embodiments are for illustrative purposes. Note that the description will proceed in the following order.
1. General description of semiconductor device of the present disclosure
2. First embodiment (semiconductor device of the present disclosure)
3. Second Embodiment (modification of first embodiment)
4. Others <General Description of Semiconductor Device of the Present Disclosure>

In a semiconductor device of the present disclosure, a channel formation region layer is capable of including a channel structure portion having the structure of nanowire or nanosheet. Specifically, the channel structure portion forming one channel formation region layer includes one or a plurality of nanowire structures or nanosheet structures. An outer peripheral portion of the nanowire structure (specifically, a first end face and a third end face described below of each channel formation region layer having the nanowire structure) is covered with an insulating layer. The space between the nanosheet structures is filled with an insulating layer. One or a plurality of nanowire structures or nanosheet structures is juxtaposed along the width direction of one channel formation region layer.

In the semiconductor device of the present disclosure including
the channel formation region layers each have a first end face adjacent to the first end face of the gate electrode layer, a second end face adjacent to the second end face of the gate electrode layer, a third end face adjacent to the third end face of the gate electrode layer, and a fourth end face adjacent to the fourth end face of the gate electrode layer, the second end face of each of the channel formation region layers has a channel structure portion connected to one of source/drain regions common to the channel formation region layers, and the fourth end face of each of the channel formation region layers has a channel structure portion connected to the other of the source/drain regions common to the channel formation region layers. Then, in this case, the second end face of each of the gate electrode layers can be opposed to one of the source/drain regions via an insulating material layer, and the fourth end face of each of the gate electrode layers can be opposed to the other of the source/drain regions via an insulating material layer.

Further, in the semiconductor device of the present disclosure including the various preferable modes described above, a third end face of an odd-numbered layer of the gate electrode layers and a first end face of an even-numbered layer of the gate electrode layers can be covered with the insulating material layer. Furthermore, the second end face and the fourth end face of the gate electrode layer can be also covered with the insulating material layer.

Further, in the semiconductor device of the present disclosure including the various preferable modes described above, the first end face of the odd-numbered layer of the gate electrode layers can protrude from a first end face of the channel formation region layer, and the third end face of the even-numbered layer of the gate electrode layers can protrude from a third end face of the channel formation region layer.

Further, in the semiconductor device of the present disclosure including the various preferable modes described above, one of a first contact portion and a second contact portion can be connected to a first wiring (specifically, e.g., a wiring functions as a signal line; the same applies to the following description). The other can be connected to a second wiring (specifically, e.g., a wiring functioning as a back bias potential power supply line for applying a back bias such as a reverse back bias or a forward back bias, or alternatively a wiring functioning as a power supply line $V_{dd}$ or a power supply line $V_{ss}$; the same applies to the following description).

In the semiconductor device of the present disclosure including the various preferred embodiments described above (hereinafter, referred to as "semiconductor device or the like of the present disclosure"), examples of the base can include a silicon semiconductor substrate, a Si-on-insulator (SOI) substrate, or a SiGe-on-insulator (SGOI) substrate. Examples of materials forming the channel structure portion can include Si, SiGe, Ge, and InGaAs. The semiconductor device or the like of the present disclosure can be either an n-channel type or a p-channel type. In the case of employing an n-channel type, the channel structure can include Si, and in the case of employing a p-channel type, the channel structure portion can include SiGe. The determination as to whether the semiconductor device or the like of the present disclosure is an n-channel type or a p-channel type is performed solely by selecting a material forming the gate electrode layer from the viewpoint of obtaining an optimum work function for each. In the case of using the Si-channel structure portion and the n-channel semiconductor device, examples of a material for forming the gate electrode layer can include TiN, TaN, Al, TiAl, and W. On the other hand, in the case of using the SiGe-channel structure portion and the p-channel semiconductor device, examples of a material for forming the gate electrode layer can include TiN and W.

Examples of a material forming the gate insulating film can include $SiO_2$, SiN, and SiON, or can include high dielectric constant materials (so-called High-k material), such as $HfO_2$, HfAlON, and $Y_2O_3$.

In the nanowire structure, both ends of a wire of a diameter of, in one example, 5 nm to 10 nm and constituted by including, in one example, Si or SiGe, are connected by one and the other of source/drain regions, or supported by one and the other of source/drain regions. In addition, in the nanosheet structure, both ends of a material that has a cross-sectional shape of substantially rectangular constituted by including, in one example, Si or SiGe whose width× thickness is, in one example, (10 nm to 50 nm)×(5 nm to 10 nm) are connected by one and the other of source/drain regions, or supported by one and the other of source/drain regions. Moreover, the determination as to whether to use nanowire structure or nanosheet structure depends on the thickness and width of the material forming the structure as mentioned above. Examples of the material forming the source/drain regions can include silicon (Si), SiGe, and Ge. In addition, examples of materials forming the first contact portion and the second contact portion can include silicon (Si), aluminum or aluminum-based alloy (e.g., pure aluminum, Al—Si, Al—Cu, Al—Si—Cu, Al—Ge, Al—Si—Ge), polysilicon, copper, copper alloy, tungsten, tungsten alloy, titanium, titanium alloy (including TiW, TiNW, TiN, and TiAl), $WSi_2$, $MoSi_2$, and TaN. In addition, examples of materials forming the insulating material layer can include $SiO_X$-based materials (materials forming silicon-based oxide film); SiN-based materials including SiON-based materials such as SiN and SiON; SiOC; SiOF; and SiCN. Examples of $SiO_X$-based materials include $SiO_2$, non-doped silicate glass (NSG), borophosphosilicate glass (BPSG), PSG, BSG, AsSG, SbSG, PbSG, spin-on-glass (SOG), low temperature oxide (LTO, low temperature CVD-$SiO_2$), low-melting glass, and glass paste. Alternatively, examples of materials forming the insulating material layer can include inorganic insulating materials such as titanium oxide ($TiO_2$), tantalum oxide ($Ta_2O_5$), aluminum oxide ($Al_2O_3$), magnesium oxide (MgO), chromium oxide ($CrO_x$), zirconium oxide ($ZrO_2$), niobium oxide ($Nb_2O_5$), tin oxide ($SnO_2$), and vanadium oxide ($VO_x$). Alternatively, examples of materials forming the insulating material layer can include various resins such as polyimide-based resin, epoxy-based resin, or acrylic resin and low dielectric constant insulating materials such as SiOCH, organic SOG, or fluorine-based resin (e.g., a material having a dielectric constant k ($=\varepsilon/\varepsilon_0$) of, e.g., 3.5 or less, specifically, e.g., fluorocarbon, cycloperfluorocarbon polymer, benzocyclobutene, cyclic fluororesin, polytetrafluoroethylene, amorphous tetrafluoroethylene, polyarylether, fluorinated arylether, fluorinated polyimide, amorphous carbon, parylene (polyparaxylylene), or fluorinated fullerene). Alternatively, examples of materials forming the insulating material layer can include Silk (trademark of The Dow Chemical Co., coating type low dielectric constant interlayer insulation film material) and Flare (trademark of Honeywell Electronic Materials Co., polyallyl ether (PAE)-based material). In addition, these materials can be used alone or in appropriate combination thereof. The insulating layer and the interlayer insulating layer described later can also be formed using the above-mentioned materials. The insulating material layer, the insulating layer, and the interlayer insulating layer can be formed using known methods including various CVD methods, various coating methods, various PVD methods such as a sputtering method and a vacuum evaporation method, various printing methods such as a screen printing method, plating methods, electrodeposition methods, immersion methods, and sol-gel methods.

Note that it is also possible to obtain the SiGe layer by a process of placing a SiGe layer on the upper layer and a Si layer on the lower layer and performing the oxidation to cause the upper SiGe layer to be $SiO_2$ and the lower Si layer to be SiGe layer.

First Embodiment

Figure 1B:
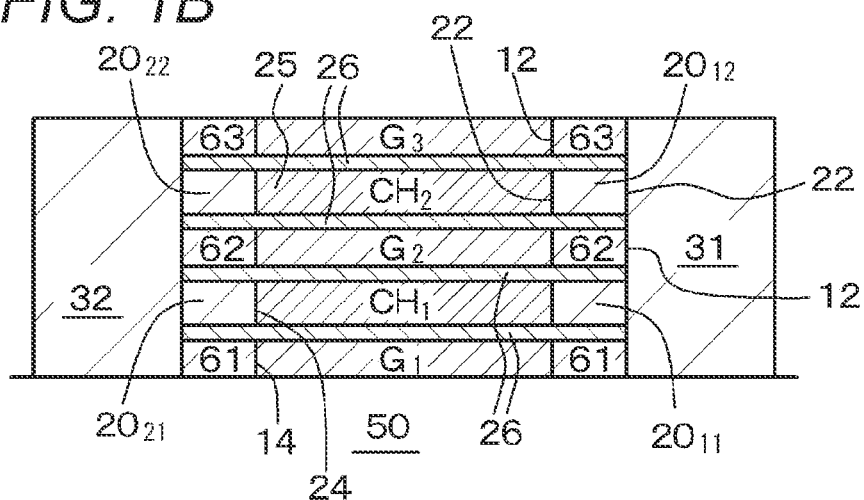
Figure 1C:
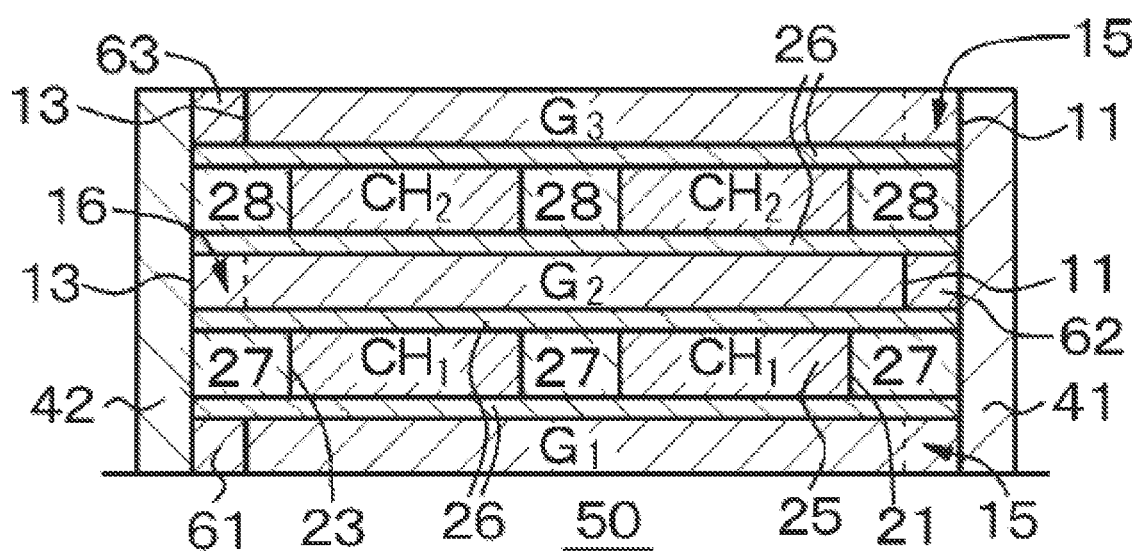
Figure 2A:
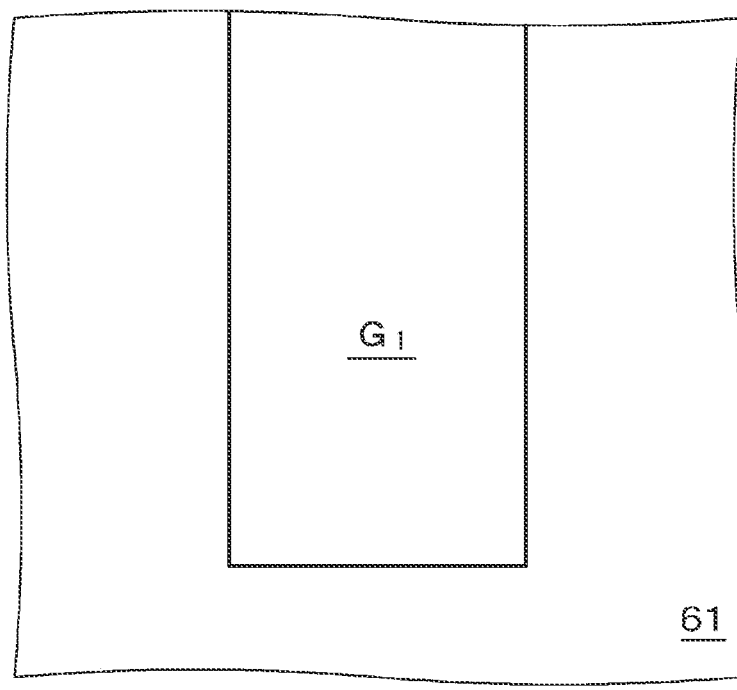
FIGS. 2A, 2B, and 2C are, for describing a method of manufacturing the semiconductor device according to the first embodiment, respectively a schematic partial plan view of a base and the like, a similar schematic partial cross-sectional view taken along the arrow B-B in FIG. 1A, and a similar schematic partial cross-sectional view taken along the arrow C-C in FIG. 1A.
Figure 2B:
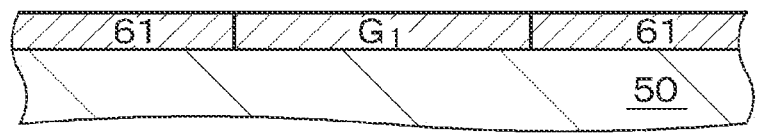
Figure 2C:
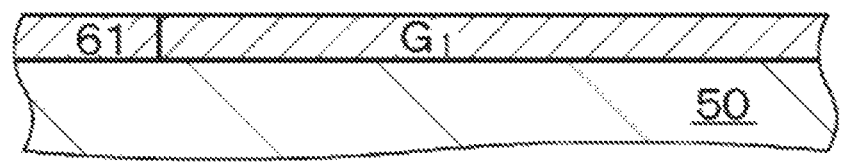
Figure 3A:
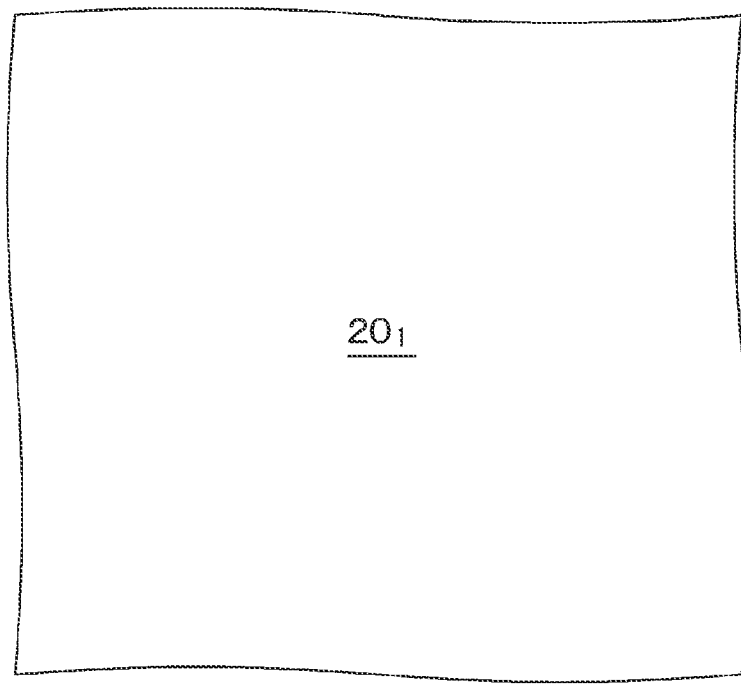
FIGS. 3A, 3B, and 3C are, following FIGS. 2A, 2B, and 2C, respectively, for describing a method of manufacturing the semiconductor device according to the first embodiment, respectively a schematic partial plan view of a base and the like, a similar schematic partial cross-sectional view taken along the arrow B-B in FIG. 1A, and a similar schematic partial cross-sectional view taken along the arrow C-C in FIG. 1A.
Figure 3B:
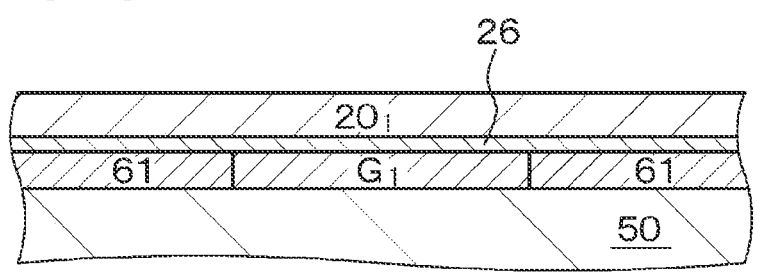
Figure 3C:
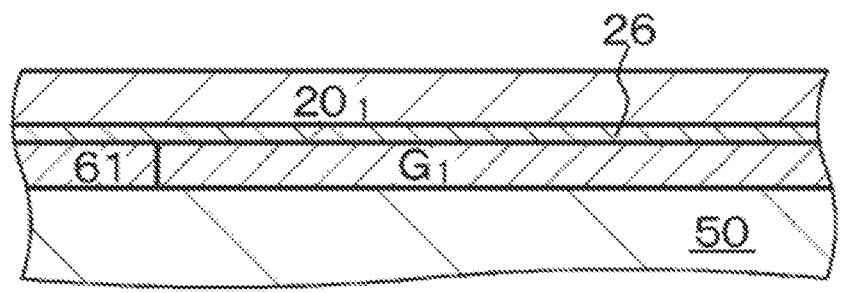
Figure 4A:
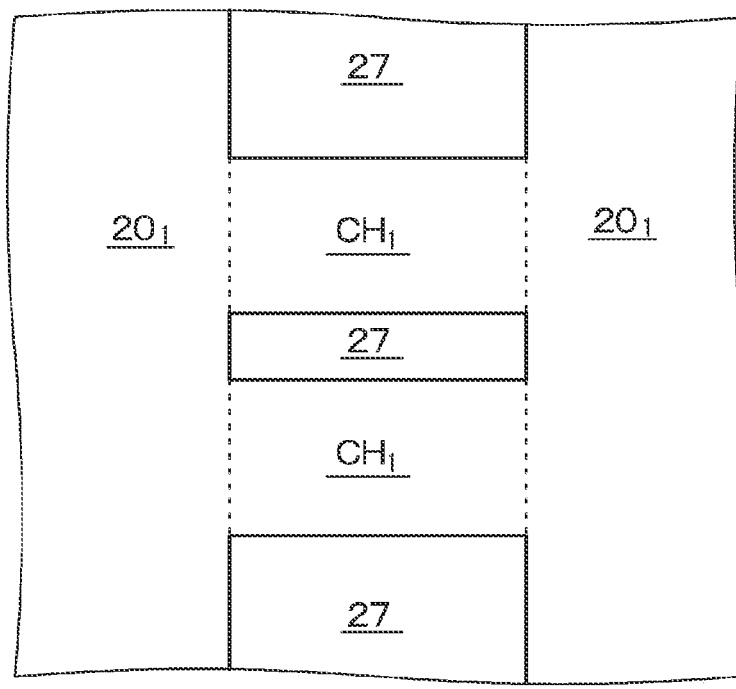
FIGS. 4A, 4B, and 4C are, following FIGS. 3A, 3B, and 3C, respectively, for describing a method of manufacturing the semiconductor device according to the first embodiment, respectively a schematic partial plan view of a base and the like, a similar schematic partial cross-sectional view taken along the arrow B-B in FIG. 1A, and a similar schematic partial cross-sectional view taken along the arrow C-C in FIG. 1A.
Figure 4B:
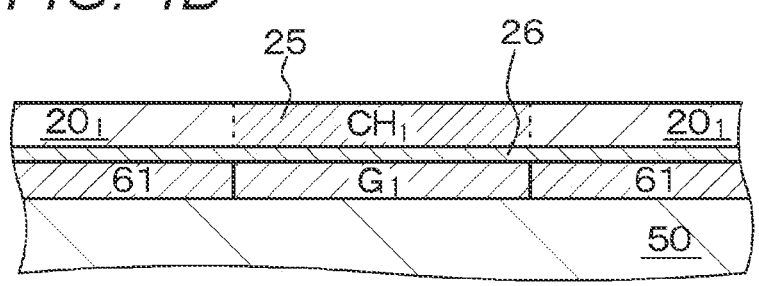
Figure 4C:
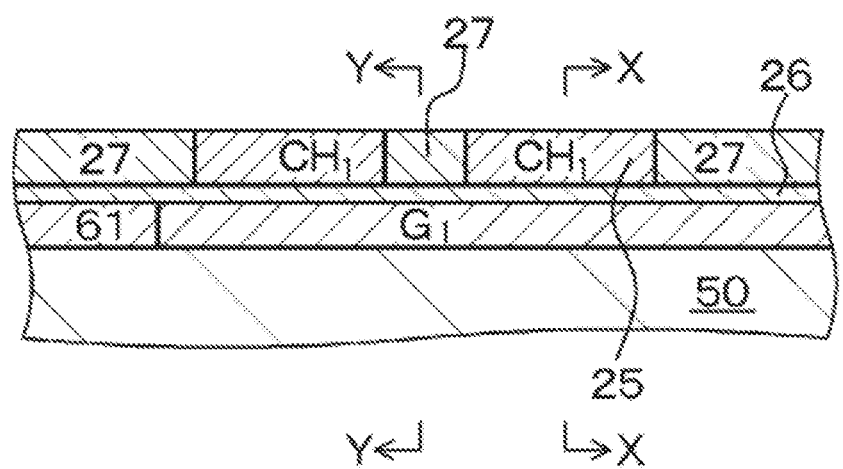
Figure 5A:
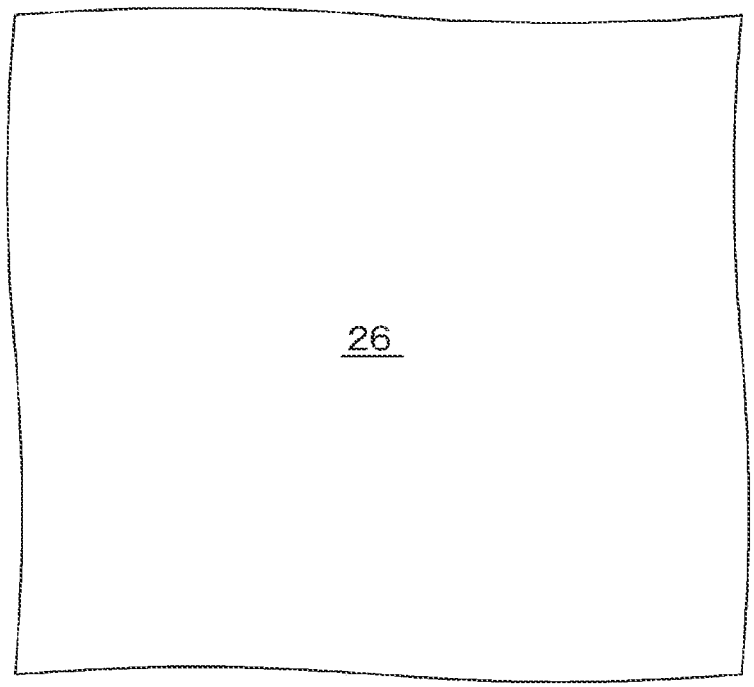
FIGS. 5A, 5B, and 5C are, following FIGS. 4A, 4B, and 4C, respectively, for describing a method of manufacturing the semiconductor device according to the first embodiment, respectively a schematic partial plan view of a base and the like, a similar schematic partial cross-sectional view taken along the arrow B-B in FIG. 1A, and a similar schematic partial cross-sectional view taken along the arrow C-C in FIG. 1A.
Figure 5B:
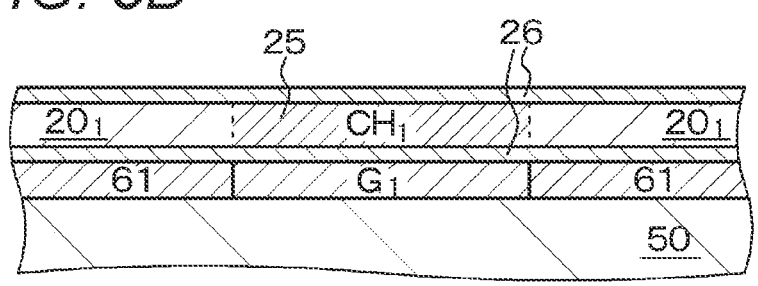
Figure 5C:
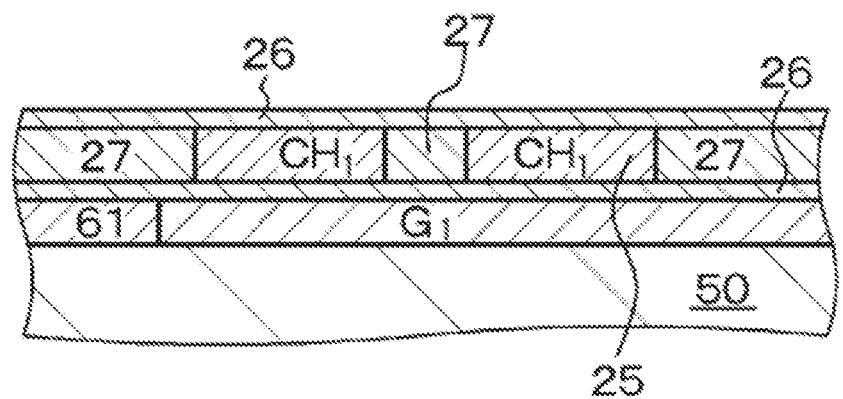
Figure 6A:
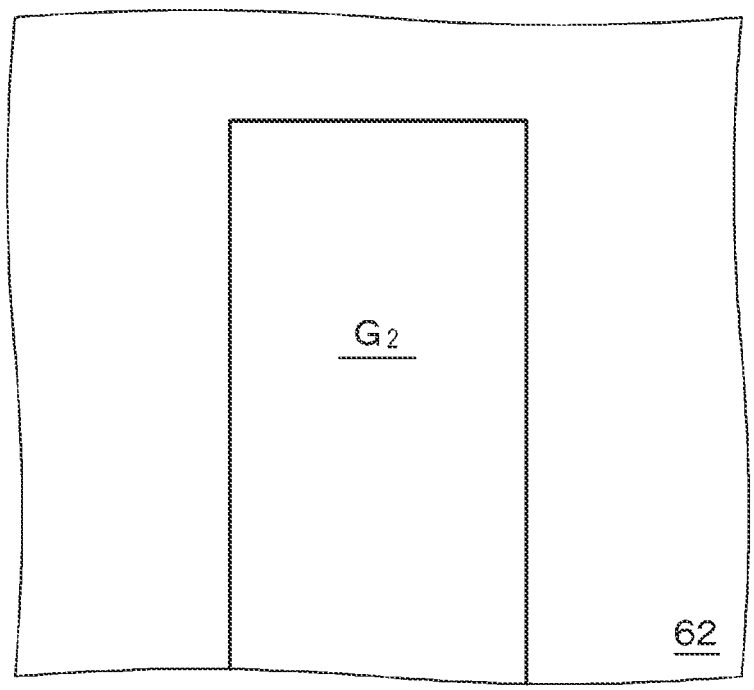
FIGS. 6A, 6B, and 6C are, following FIGS. 5A, 5B, and 5C, respectively, for describing a method of manufacturing the semiconductor device according to the first embodiment, respectively a schematic partial plan view of a base and the like, a similar schematic partial cross-sectional view taken along the arrow B-B in FIG. 1A, and a similar schematic partial cross-sectional view taken along the arrow C-C in FIG. 1A.
Figure 6B:
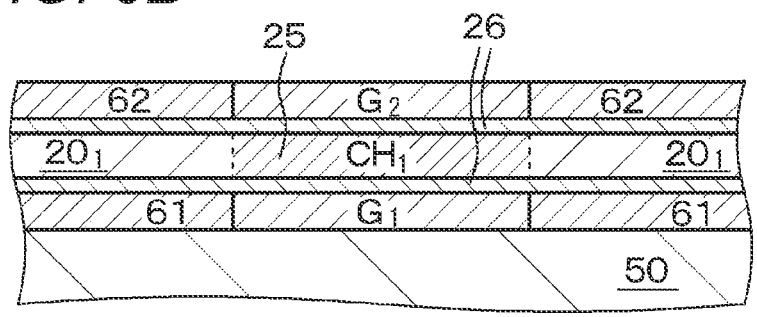
Figure 6C:
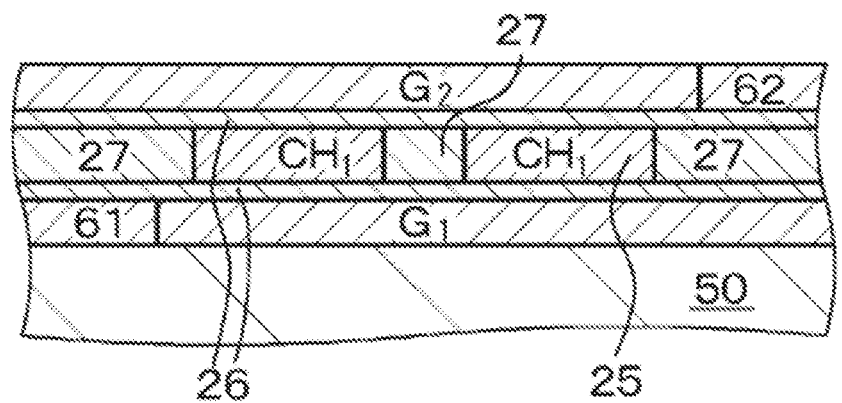
Figure 7A:
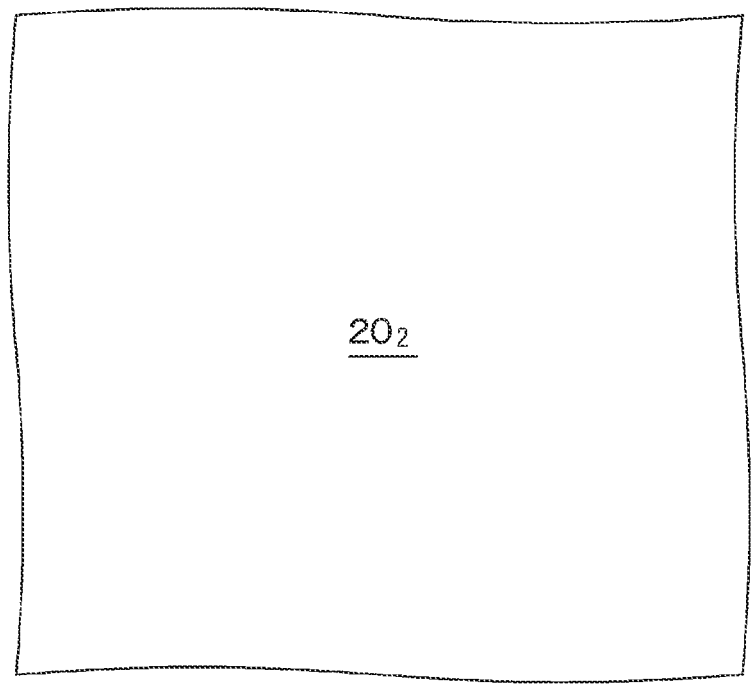
FIGS. 7A, 7B, and 7C are, following FIGS. 6A, 6B, and 6C, respectively, for describing a method of manufacturing the semiconductor device according to the first embodiment, respectively a schematic partial plan view of a base and the like, a similar schematic partial cross-sectional view taken along the arrow B-B in FIG. 1A, and a similar schematic partial cross-sectional view taken along the arrow C-C in FIG. 1A.
Figure 7B:
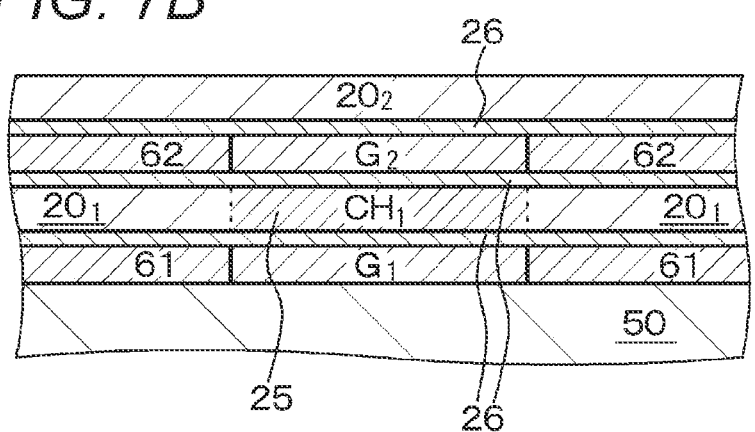
Figure 7C:
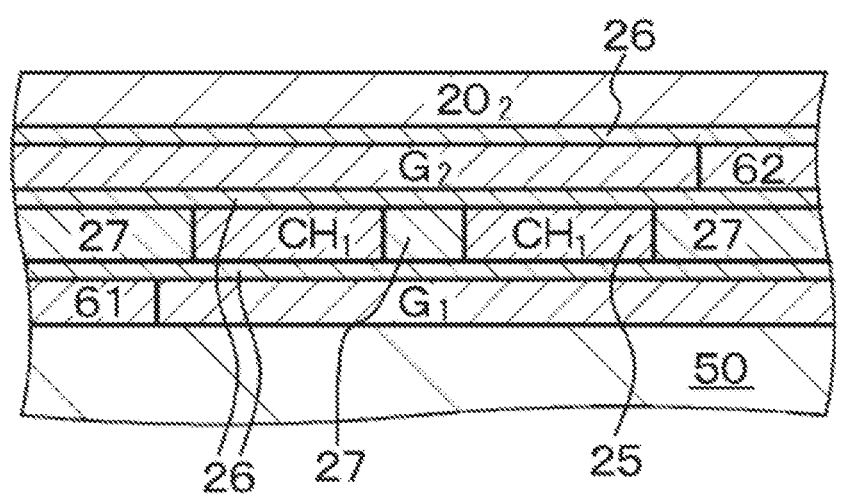
Figure 8A:
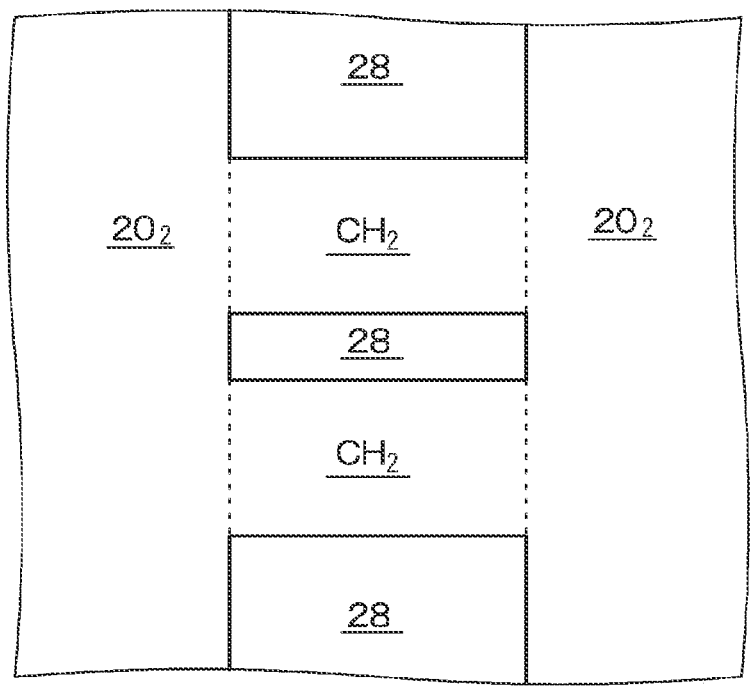
FIGS. 8A, 8B, and 8C are, following FIGS. 7A, 7B, and 7C, respectively, for describing a method of manufacturing the semiconductor device according to the first embodiment, respectively a schematic partial plan view of a base and the like, a similar schematic partial cross-sectional view taken along the arrow B-B in FIG. 1A, and a similar schematic partial cross-sectional view taken along the arrow C-C in FIG. 1A.
Figure 8B:
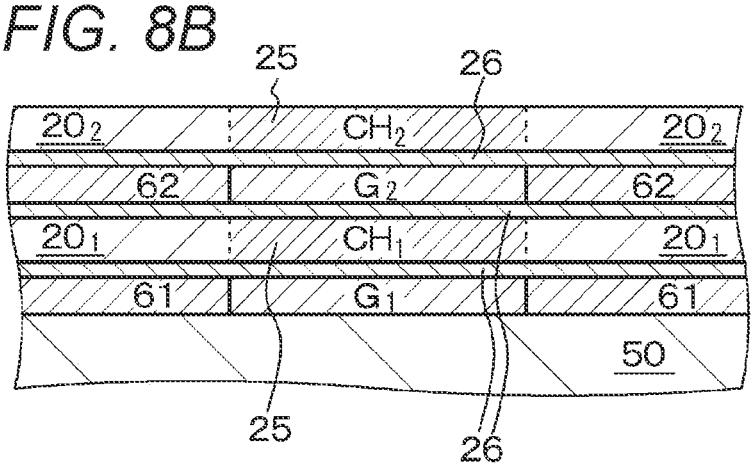
Figure 8C:
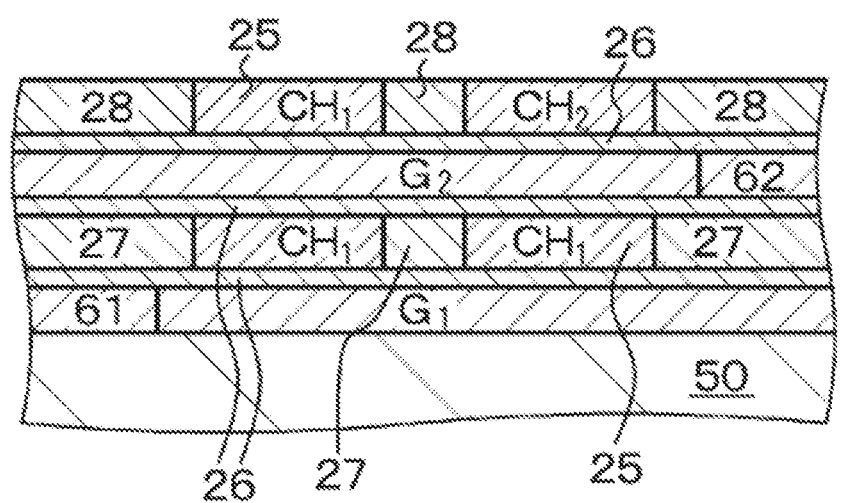
Figure 9A:
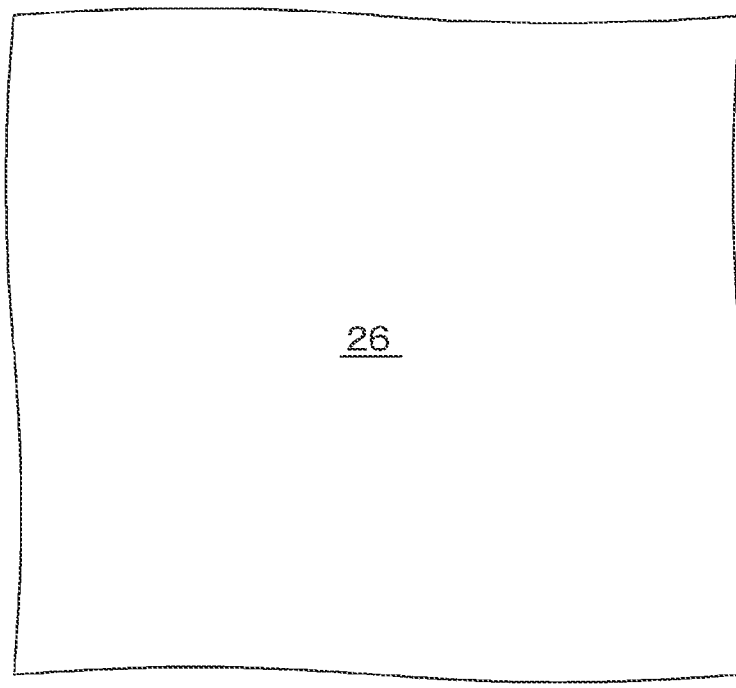
FIGS. 9A, 9B, and 9C are, following FIGS. 8A, 8B, and 8C, respectively, for describing a method of manufacturing the semiconductor device according to the first embodiment, respectively a schematic partial plan view of a base and the like, a similar schematic partial cross-sectional view taken along the arrow B-B in FIG. 1A, and a similar schematic partial cross-sectional view taken along the arrow C-C in FIG. 1A.
Figure 9B:
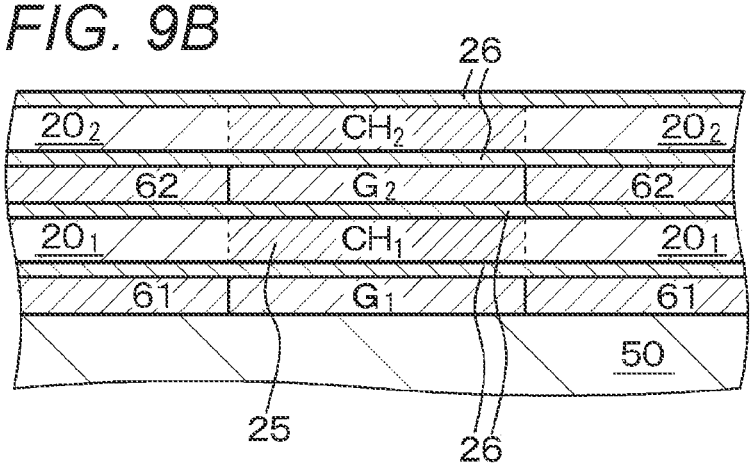
Figure 9C:
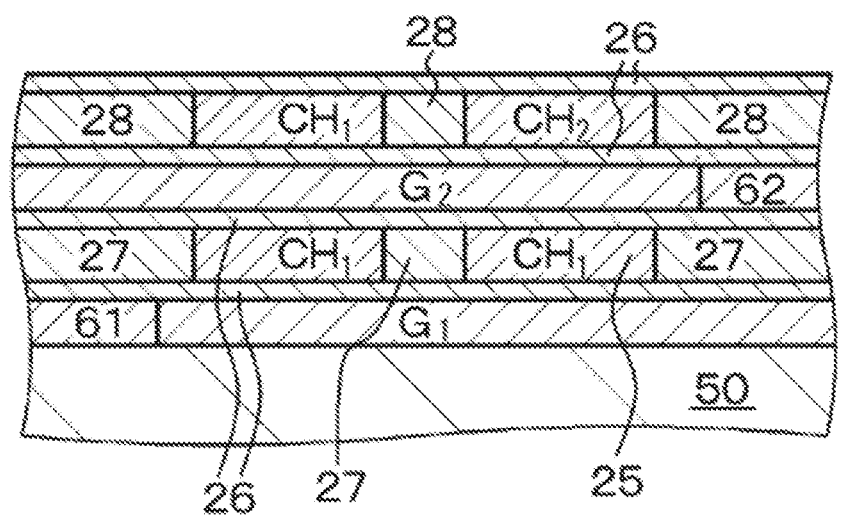
Figure 10A:
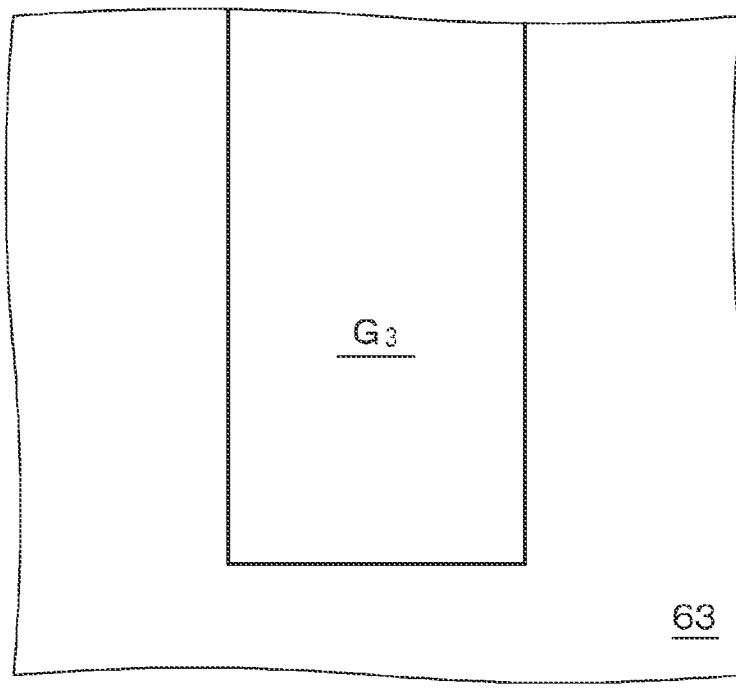
FIGS. 10A, 10B, and 10C are, following FIGS. 9A, 9B, and 9C, respectively, for describing a method of manufacturing the semiconductor device according to the first embodiment, respectively a schematic partial plan view of a base and the like, a similar schematic partial cross-sectional view taken along the arrow B-B in FIG. 1A, and a similar schematic partial cross-sectional view taken along the arrow C-C in FIG. 1A.
Figure 10B:
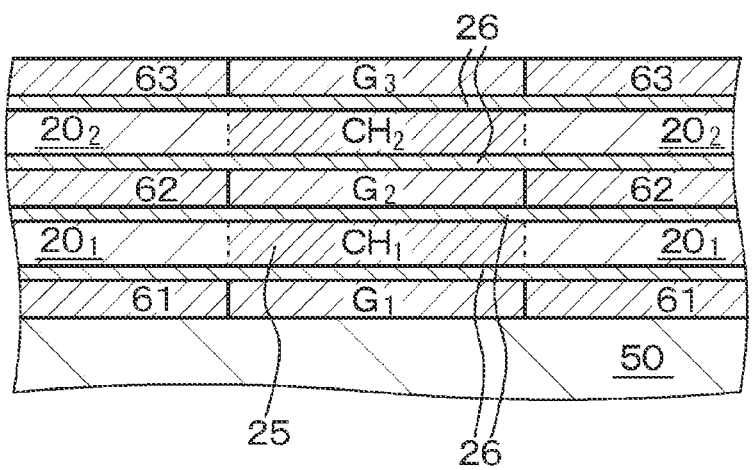
Figure 10C:
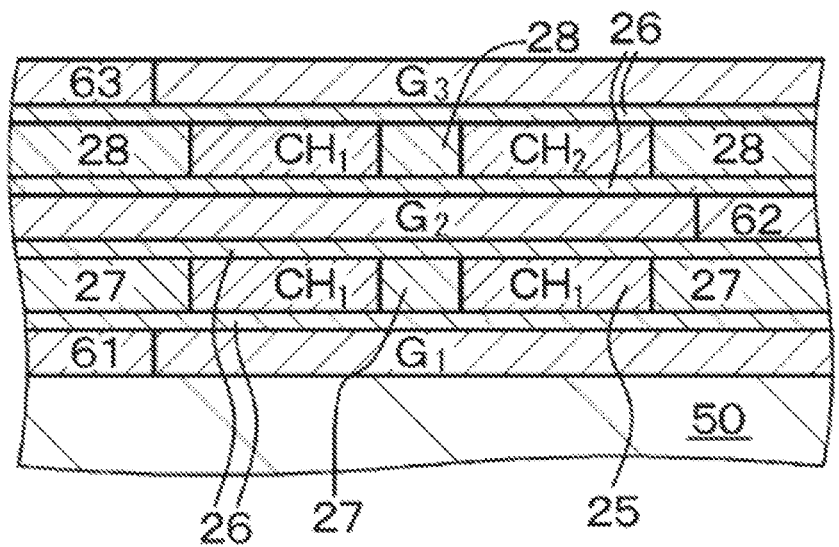

A first embodiment relates to a semiconductor device (field effect transistor and specifically nanowire FET) of the present disclosure. FIG. 1A is a view (a schematic partial plan view) of the semiconductor device of the first embodiment when viewed from above the semiconductor device, FIG. 1B is a schematic cross-sectional view taken along an arrow B-B in FIG. 1A, and FIG. 1C is a schematic cross-sectional view taken along an arrow C-C in FIG. 1A.

A semiconductor device of the first embodiment of the second embodiment includes:

a stacked structure having channel formation region layers $CH_1$ and $CH_2$, and gate electrode layers $G_1$, $G_2$, and $G_3$ alternately arranged on top of each other on a base 50, a lowermost layer of the stacked structure is formed with a $1^{st}$ layer of the gate electrode layers $G_1$, an uppermost layer of the stacked structure is formed with an $N^{th}$ (where N≥3) layer of the gate electrode layers $G_3$, the gate electrode layers $G_1$, $G_2$, and $G_3$ each have a first end face 11, a second end face 12, a third end face 13 opposing the first end face 11, and a fourth end face 14 opposing the second end face 12, the first end face 11 of the odd-numbered layers $G_1$ and $G_3$ of the gate electrode layers is connected to a first contact portion 41, and the third end face 13 of the even-numbered layer $G_2$ of the gate electrode layers is connected to a second contact portion 42.

Then, in the semiconductor devices according to the first embodiment or a second embodiment described later, the channel formation region layers $CH_1$ and $CH_2$ each include a channel structure portion 25 having a nanowire structure or a nanosheet structure (the nanosheet structure in the first embodiment). Specifically, in the first embodiment, the channel structure portion 25 forming one channel formation region layer includes a plurality (specifically, two) of nanosheet structures. The outer peripheral portions of the nanosheet structure (specifically, a first end face 21 and a third end face 23 of each of the channel formation region layers $CH_1$ and $CH_2$ described below) are covered with insulating layers 27 and 28. The space between the nanosheet structures is filled with insulating layers 27 and 28.

Further, a semiconductor device of the first embodiment of the second embodiment includes the channel formation region layers $CH_1$ and $CH_2$ each have a first end face 21 adjacent to the first end face 11 of the gate electrode layers $G_1$, $G_2$, and $G_3$, a second end face 22 adjacent to the second end face 12 of the gate electrode layer $G_1$, $G_2$, and $G_3$, a third end face 23 adjacent to the third end face 13 of the gate electrode layers $G_1$, $G_2$, and $G_3$, and a fourth end face 24 adjacent to the fourth end face 14 of the gate electrode layers $G_1$, $G_2$, and $G_3$. The second end face 22 of each of the channel formation region layers $CH_1$ and $CH_2$ has a channel structure portion 25 connected to (specifically, via the extensions $20_{11}$ and $20_{12}$ of the channel structure portion 25) one of source/drain regions 31 common to the channel formation region layers $CH_1$ and $CH_2$, and the fourth end face 24 of each of the channel formation region layers $CH_1$ and $CH_2$ has a channel structure portion 25 connected to the other of the source/drain regions 32 common to (specifically, via the extensions $20_{21}$ and $20_{22}$ of the channel structure portion 25) the channel formation region layers $CH_1$ and $CH_2$. Further, the second end face 12 of each of the gate electrode layers $G_1$, $G_2$, and $G_3$ is opposed to one of the source/drain regions 31 via insulating material layers 61, 62, and 63 corresponding to a kind of a gate side wall, and the fourth end face 14 of each of the gate electrode layers $G_1$, $G_2$, and $G_3$ is opposed to the other of the source/drain regions 32 via insulating material layers 61, 62, and 63 corresponding to a kind of a gate side wall.

Further, the third end face 13 of the odd-numbered gate electrode layers $G_1$ and $G_3$, the first end face 11 of the even-numbered gate electrode layer $G_2$, and the first end face 21 and the third end face 23 of the channel formation region layers $CH_1$ and $CH_2$ are covered with insulating material layers 61, 62, and 63 and the insulating layers 27 and 28. Furthermore, the second end face 12 and the fourth end face 14 of the gate electrode layers $G_1$, $G_2$, and $G_3$ are also covered with the insulating material layers 61, 62, and 63.

Here, the first end face 11 of the odd-numbered gate electrode layers $G_1$ and $G_3$ protrudes from the first end face 21 of the channel formation region layers $CH_1$ and $CH_2$ (this portion is indicated by a protruding portion 15). The third end face 13 of the even-numbered gate electrode layer $G_2$ protrudes from the third end face 23 of the channel formation region layers $CH_1$ and $CH_2$ (this portion is indicated by a protruding portion 16). One 41 of the first contact portion 41 and the second contact portion 42 is connected to the first wiring (specifically, e.g., a wiring functioning as a signal line). The other 42 is connected to the second wiring (Specifically, e.g., a wiring functioning as a back bias potential power supply line).

The base 50 includes a silicon semiconductor substrate, and the channel structure portion 25 includes silicon (Si). The semiconductor device according to the first embodiment or a semiconductor device according to a second embodiment described later is an n-channel type. Examples of the material forming the gate electrode layers $G_1$, $G_2$, and $G_3$ can include TiN, TaN, Al, TiAl, and W. A gate insulating film 26 includes $SiO_2$, SiN, SiON, high dielectric constant material (so-called High-k material), such as $HfO_2$, HfAlON, $Y_2O_3$. The source/drain regions 31 and 32 include silicon. The first contact portion 41 and the second contact portion 42 include, for example, TiN, TaN, Al, TiAl, and W. The insulating layers 27 and 28 and the insulating material layers 61, 62, and 63 include $SiO_2$, SiN, or SiON.

Hereinafter, the method of manufacturing the semiconductor device according to the first embodiment will be explained with reference to FIG. 2A, FIG. 2B, FIG. 2C, FIG. 3A, FIG. 3B, FIG. 3C, FIG. 4A, FIG. 4B, FIGS. 4C, 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, and 13C. FIGS. 2A, 3A, 4A, 5A, 6A, 7A, 8A, 9A, 10A, 11A, 12A, and 13A are schematic partial plan views of a base and the like, and FIGS. 2B, 3B, 4B, 5B, 6B, 7B, 8B, 9B, 10B, 11B, 12B, and 13B are similar schematic partial cross-sectional views taken along the arrow B-B in FIG. 1A, and FIGS. 2C, 3C, 4C, 5C, 6C, 7C, 8C, 9C, 10C, 11C, 12C, and 13C are similar schematic partial cross-sectional views taken along the arrow C-C in FIG. 1A.

[Process-100]

On the base 50 including a silicon semiconductor substrate, an element isolation region (not shown) is first formed. Then, the gate electrode layer $G_1$ is formed in a region of the base 50 where an active region is to be formed using the sputtering, photolithography, and etching techniques. Subsequently, the insulating material layer 61 is formed using the CVD method on the region of the base 50 from which the gate electrode layer $G_1$ is removed, and the insulating material layer 61 is flattened. Thus, the structures shown in FIGS. 2A, 2B, and 2C can be obtained.

Moreover, in the following description of the method of manufacturing the semiconductor device according to the first embodiment, the terms of the gate electrode layers $G_1$, $G_2$, and $G_3$ are used. However, in [Process-100] to [Process-180], practically, conductive material layers before functioning as the gate electrode layers $G_1$, $G_2$, and $G_3$ are formed, and these conductive material layers are also preferably referred to as "gate electrode forming layer", but terms of gate electrode layers $G_1$, $G_2$, and $G_3$ are used for simplification of description.

[Process-110]

Then, a silicon layer $20_1$ on which the lower gate insulating film 26 is previously formed is provided on the gate electrode layer $G_1$ and the insulating material layer 61 using the smart cut method. Thus, the structures shown in FIGS. 3A, 3B, and 3C can be obtained.

[Process-120]

Subsequently, the channel structure portion 25 and the insulating layer 27 are formed in the silicon layer $20_1$ to obtain the channel formation region layer $CH_1$. Specifically, a region where the silicon layer $20_1$ is unnecessary is removed using the photolithography and etching techniques, the insulating layer 27 is formed on the exposed surface by using the CVD method, and the insulating layer 27 is flattened. Thus, the structures shown in FIGS. 4A, 4B, and 4C can be obtained. Moreover, the silicon layer $20_1$ located between the nanosheet structures is also removed, and the insulating layer 27 is filled in the region where the silicon layer $20_1$ is removed. The silicon layers $20_1$ located on both sides of the region where the insulating layer 27 is filled correspond to the channel formation region layer $CH_1$ (the channel structure portion 25).

[Process-130]

Subsequently, the upper gate insulating film 26 is formed on the entire surface including the upper surface of the channel formation region layer $CH_1$ using the sputtering, photolithography, and etching techniques (see FIGS. 5A, 5B, and 5C), and further the gate electrode layer $G_2$ is formed thereon. Subsequently, the insulating material layer 62 is formed using the CVD method on the region from which the gate electrode layer $G_2$ is removed, and the insulating material layer 62 is flattened. Thus, the structures shown in FIGS. 6A, 6B, and 6C can be obtained.

[Process-140]

Then, a silicon layer $20_2$ on which the lower gate insulating film 26 is previously formed is provided on the gate electrode layer $G_2$ and the insulating material layer 62 using the smart cut method. Thus, the structures shown in FIGS. 7A, 7B, and 7C can be obtained.

[Process-150]

Subsequently, the channel structure portion 25 and the insulating layer 28 are formed in the silicon layer $20_2$ to obtain the channel formation region layer $CH_2$. Specifically, a region where the silicon layer $20_2$ is unnecessary is removed using the photolithography and etching techniques, the insulating layer 28 is formed on the exposed surface by using the CVD method, and the insulating layer 28 is flattened. Thus, the structures shown in FIGS. 8A, 8B, and 8C can be obtained. Moreover, the silicon layer $20_2$ located between the nanosheet structures is also removed, and the insulating layer 28 is filled in the region where the silicon layer $20_2$ is removed. The silicon layers $20_2$ located on both sides of the region where the insulating layer 28 is filled correspond to the channel formation region layer $CH_2$ (the channel structure portion 25).

[Process-160]

Subsequently, the upper gate insulating film 26 is formed on the entire surface including the upper surface of the channel formation region layer $CH_2$ using the sputtering, photolithography, and etching techniques (see FIGS. 9A, 9B, and 9C), and further the gate electrode layer $G_3$ is formed thereon. Subsequently, the insulating material layer 63 is formed using the CVD method on the region from which the gate electrode layer $G_3$ is removed, and the insulating material layer 63 is flattened. Thus, the structures shown in FIGS. 10A, 10B, and 10C can be obtained.

[Process-170]

Subsequently, the source/drain regions 31 and 32 are formed. Specifically, an etching resist layer is formed on the gate electrode layer $G_3$ and the like to cover a desired region. Then, by using the etching resist layer as an etching mask, the insulating material layer 63, the silicon layer $20_2$, the insulating material layer 62, the silicon layer $20_1$, and the insulating material layer 61 are etched, and then the etching resist layer is removed. Thus, the structures shown in FIGS. 11A, 11B, and 11C can be obtained. The extensions $20_{11}$ and $20_{12}$ of the channel structure portion 25 are left on the second end faces 22 of the respective channel formation region layers $CH_1$ and $CH_2$. The extensions $20_{21}$ and $20_{22}$ of the channel structure portion 25 are left on the fourth end faces 24 of the respective channel formation region layers $CH_1$ and $CH_2$. Then, a mask layer 71 is formed to surround the region of the base 50 where the source/drain regions 31 and 32 are to be formed, and the source/drain region 31 and 32 including silicon are formed on the exposed base 50 using the epitaxial growth method. Thus, the structures shown in FIGS. 12A, 12B, and 12C can be obtained.

[Process-180]

Subsequently, the mask layer 71 is removed. The first contact portions 41 connected to the first end faces 11 of the odd-numbered gate electrode layers $G_1$ and $G_3$ and the second contact portion 42 connected to the third end face 13 of the even-numbered gate electrode layer $G_2$ are formed using a known method. Thus, the structures shown in FIGS. 13A, 13B, and 13C and FIGS. 1A, 1B, and 1C can be obtained.

[Process-190]

Subsequently, an interlayer insulating layer (not shown) is formed on the entire surface. An opening is formed in the interlayer insulating layer located above the first contact portion 41, the second contact portion 42, and the source/drain regions 31 and 32. A connection hole and a wiring connected to the source/drain regions 31 and 32, and a connection hole, first wiring, and second wiring connected to the first contact portion 41 and the second contact portion 42 are only required to be formed over the interlayer insulating layer from the inside of the opening.

The semiconductor device according to the first embodiment has the stacked structure in which the channel formation region layer and the gate electrode layer are alternately stacked. The first end face of the odd-numbered gate electrode layers are connected to the first contact portion, and the third end face of the even-numbered gate electrode layers are connected to the second contact portion. Thus, different voltages can be applied to the odd-numbered gate electrode layers and the even-numbered gate electrode layers, that is, a back bias different from the gate potential can be applied. This makes it possible to reduce leakage current while improving performance in tune with the operation of the semiconductor device. Specifically, it is expected that the standby current can be reduced by 50% and the maximum frequency is increased by 30%.

Figure 20:
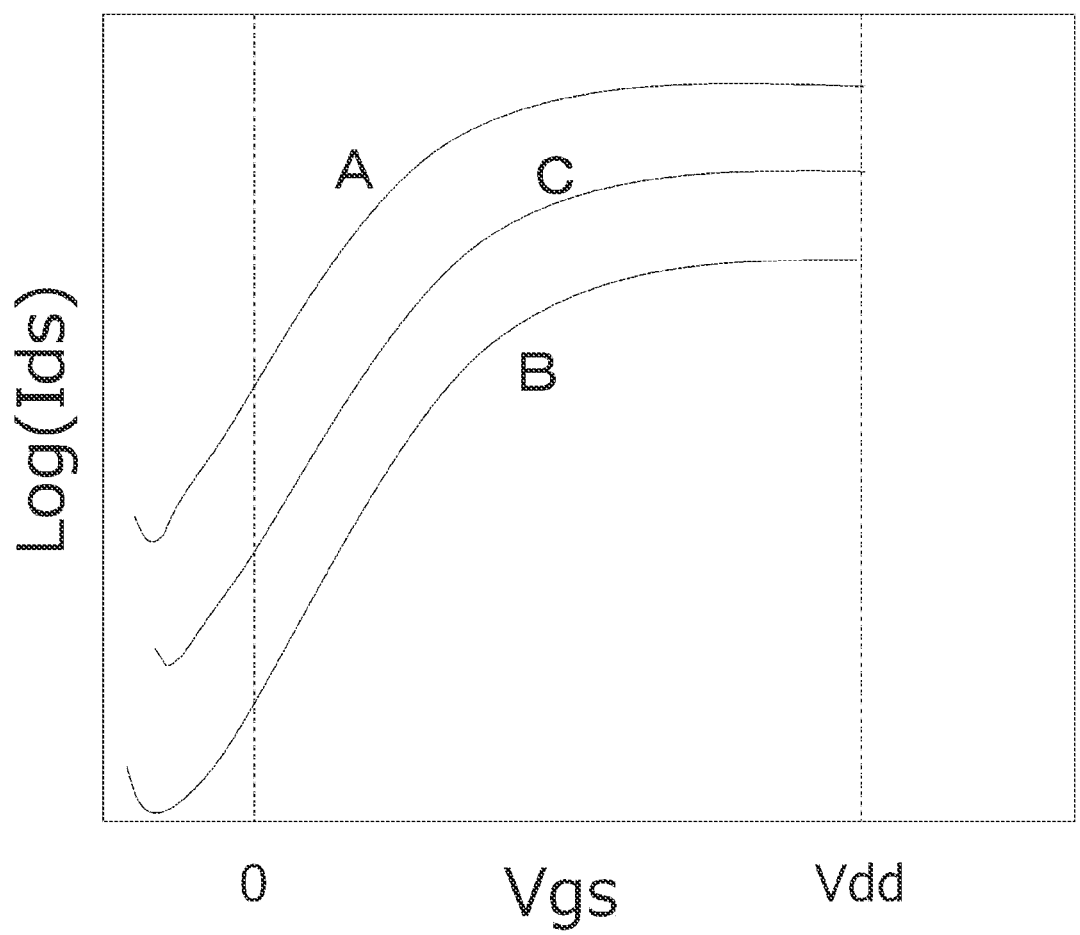
FIG. 20 is a diagram illustrated to describe that the reduction in leakage current can be achieved while improving performance in tune with the operation of a semiconductor device by applying a back bias to a channel formation region.

The relationship between the potential $V_{gs}$ applied to the gate electrode layer and the current $I_{ds}$ flowing through the channel formation region layer is schematically illustrated in FIG. 20. In one example, the first contact portion 41 is connected to the first wiring (specifically, e.g., a wiring functioning as a signal line), and the second contact portion 42 is connected to the second wiring (specifically, a wiring functioning as a back bias potential power supply line). In one example, a $V_{gs}$-$I_{ds}$ curve obtained when 0 V to $V_{dd}$ volt is applied to the first wiring and $V_{dd}$ volt (or, e.g., fixed to 2 $V_{dd}$) is fixedly applied to the second wiring is denoted as "A", which shows that it is possible to improve the performance in tune with the operation of the semiconductor device. On the other hand, a $V_{gs}$-$I_{ds}$ curve obtained when 0 V to $V_{dd}$ volt is applied to the first wiring and $-V_{dd}$ (or, e.g., fixed to $-2$ $V_{dd}$) is fixedly applied to the second wiring is denoted as "B". Moreover, the relationship between the potential $V_{gs}$ and the current $I_{ds}$ in the semiconductor device in related art having the structure to which a back bias fails to be applied is schematically denoted as "C".

In a case where the wiring length of a signal line of a logic circuit is short and a gate electrode layer connected to the signal line is formed above and below a channel formation region layer, transfer destination of heat generated in the channel formation region layer is typically limited. Thus, the heat radiation effect is expected to fail to be achieved. On the other hand, in the semiconductor device according to the first embodiment, one of the gate electrode layers formed above and below the channel formation region layer is connected to a wiring, which has a very long wiring length and is used for applying a back bias (the second wiring). Thus, the heat generated in the channel formation region layer is capable of being effectively dissipated, resulting in weakening the self-heating effect and minimizing the performance degradation. The degree of deterioration due to the self-heating effect is determined depending on many factors, and so it is difficult to be determined unconditionally. However, in the case of the semiconductor device in the related art, it is sufficiently conceivable that approximately 20% of performance degradation occurs. In other words, in the semiconductor device according to the first embodiment, it is considered that the effect of reducing the performance deterioration due to the self-heating effect of approximately 20% can be obtained.

Second Embodiment

A second embodiment is a modification of the first embodiment, and the channel formation region layers $CH_1$ and $CH_2$ include the channel structure portion 25 having a nanowire structure. In the second embodiment, the channel structure portion 25 forming one channel formation region layer includes a plurality (specifically, three) of nanowire structures.

The configuration and structure of the semiconductor device according to the second embodiment can be substantially similar to those of the semiconductor device according to the first embodiment, except that the channel structure portion 25 has the nanowire structure, so detailed description thereof is omitted. Moreover, in the semiconductor device according to the second embodiment, the insulating layers 27 and 28 are unnecessary to be formed.

Hereinafter, the method of manufacturing the semiconductor device according to the second embodiment will be explained with reference to FIGS. 15A, 15B, 15C, 16A, 16B, 16C, 17A, 17B, 17C, 18A, 18B, 18C, 19A, 19B, and 19C, which are schematic partial end views. Note that FIGS. 15A, 16A, 17A, 18A, and 19A are schematic partial end views taken along the arrow A-A in FIG. 14C, FIGS. 15B, 16B, 17B, 18B, and 19B are schematic partial end views taken along the arrow B-B in FIG. 14C, and FIGS. 15C, 16C, 17C, 18C, and 19C are schematic partial end views taken along the arrow C-C in FIG. 14A and the arrow C-C in FIG. 14B.

[Process-200]

Processes similar to [Process-100] and [Process-110] of the first embodiment are first performed.

[Process-210]

Figure 14A:
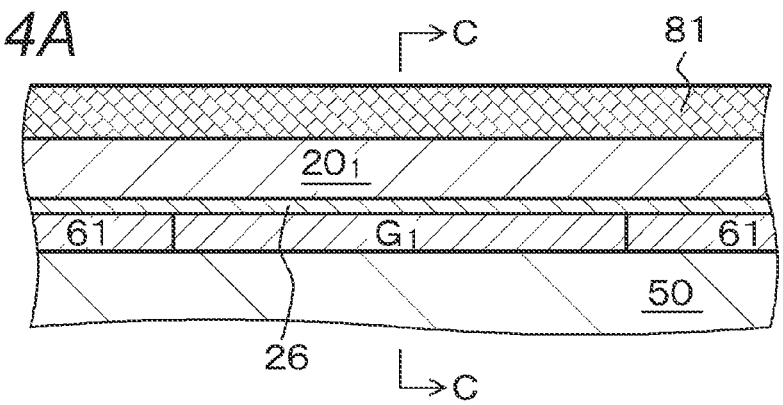
FIGS. 14A, 14B, and 14C are schematic partial end views of a base and the like for describing a method of manufacturing a semiconductor device of a second embodiment.
Figure 14B:
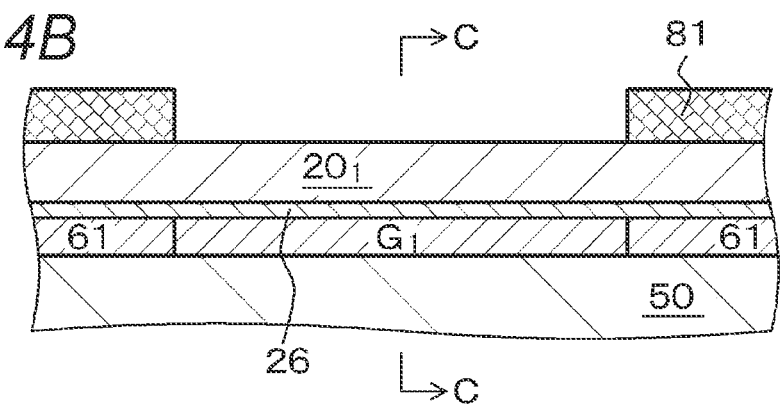
Figure 14C:
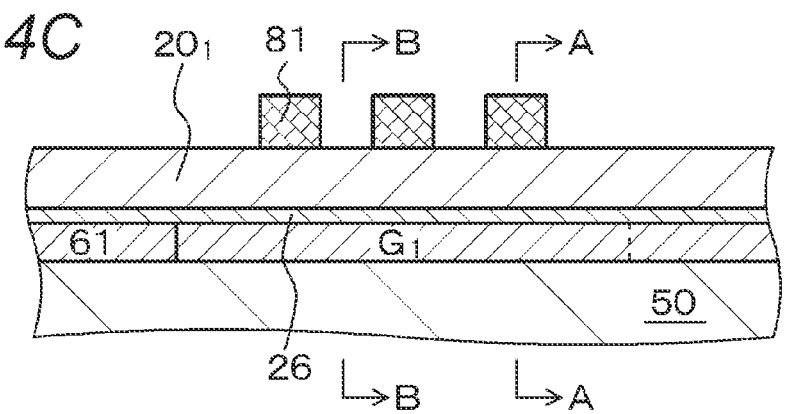
Figure 15A:
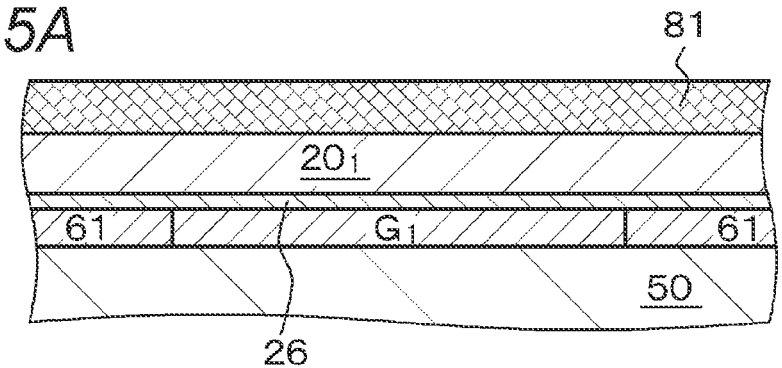
FIGS. 15A, 15B, and 15C are schematic partial end views of a base and the like following FIGS. 14A, 14B, and 14C, respectively for describing the method of manufacturing the semiconductor device according to the second embodiment.
Figure 15B:
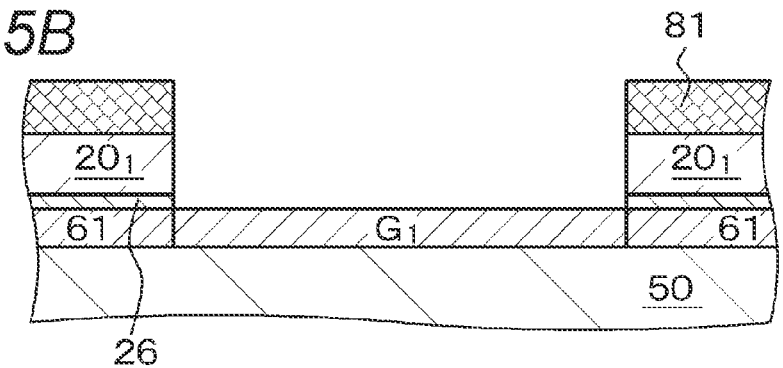
Figure 15C:
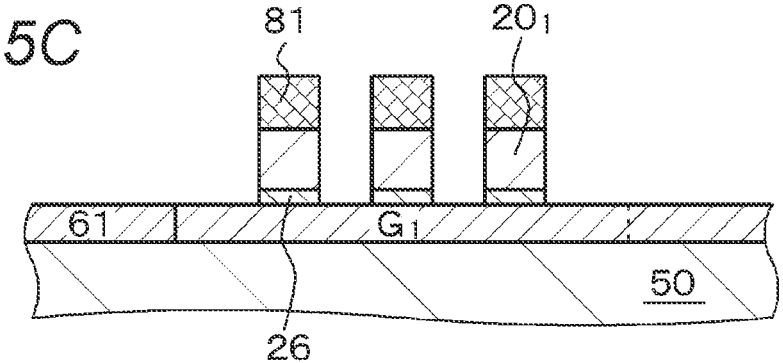
Figure 16A:
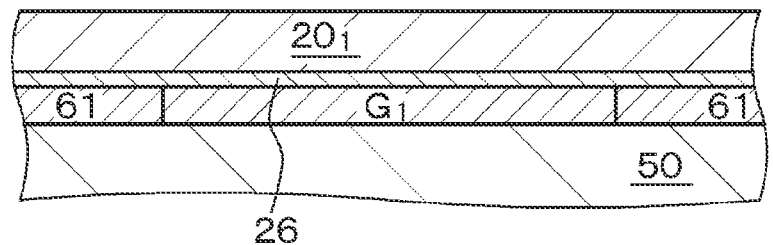
FIGS. 16A, 16B, and 16C are schematic partial end views of a base and the like following FIGS. 15A, 15B, and 15C, respectively for describing the method of manufacturing the semiconductor device according to the second embodiment.
Figure 16B:
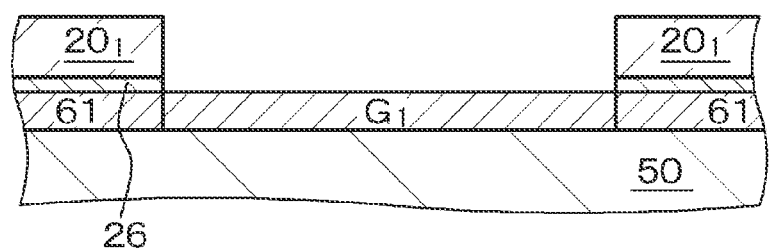
Figure 16C:
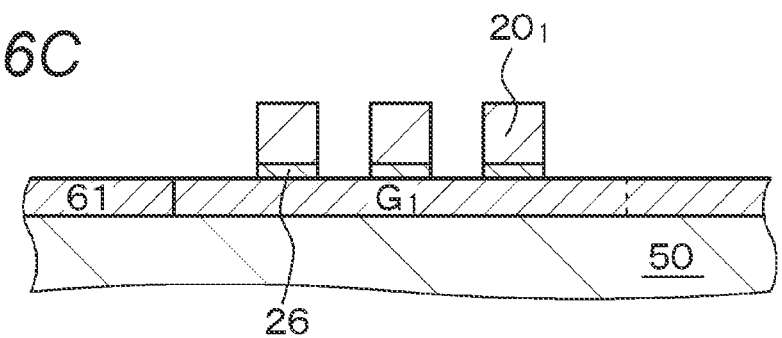

Subsequently, an etching resist layer 81 that covers both ends of the channel formation region layer $CH_1$ and covers a portion of the silicon layer $20_1$ where the nanowire structure is to be formed in the channel formation region layer $CH_1$ is provided to obtain the channel formation region layer $CH_1$ (see FIGS. 14A, 14B, and 14C). Then, after etching the silicon layer $20_1$ using the etching resist layer 81 as an etching mask (see FIGS. 15A, 15B, and 15C), the etching resist layer 81 is removed (see FIGS. 16A, 16B, and 16C). Thus, the silicon layer $20_1$ located in a region where a source/drain region is to be formed can be provided on the insulating material layer 61, and the silicon layer $20_1$ for forming the nanowire structure can be formed on the gate electrode layer $G_1$.

[Process-220]

Figure 17A:
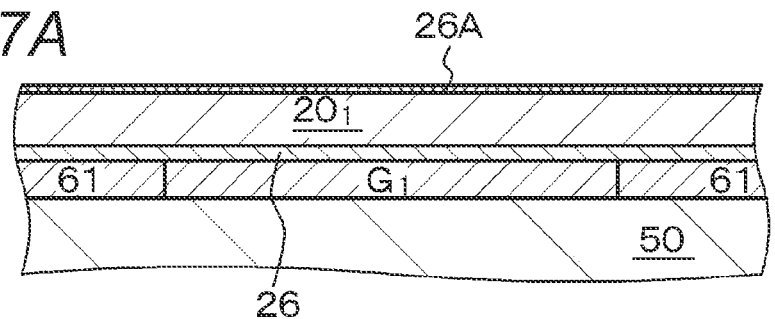
FIGS. 17A, 17B, and 17C are schematic partial end views of a base and the like following FIGS. 16A, 16B, and 16C, respectively for describing the method of manufacturing the semiconductor device according to the second embodiment.
Figure 17B:
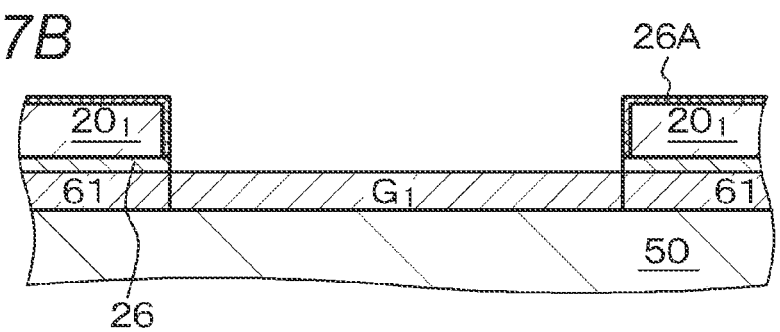
Figure 17C:
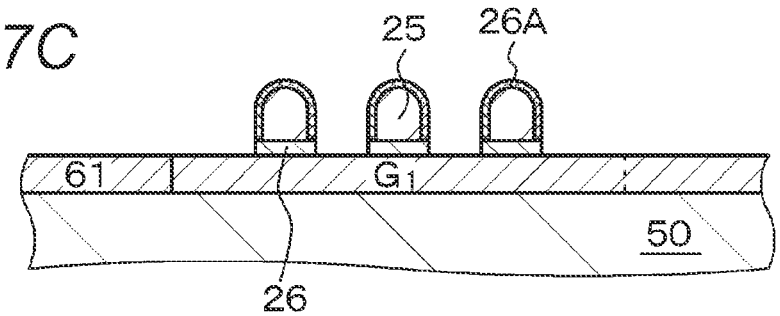
Figure 18A:
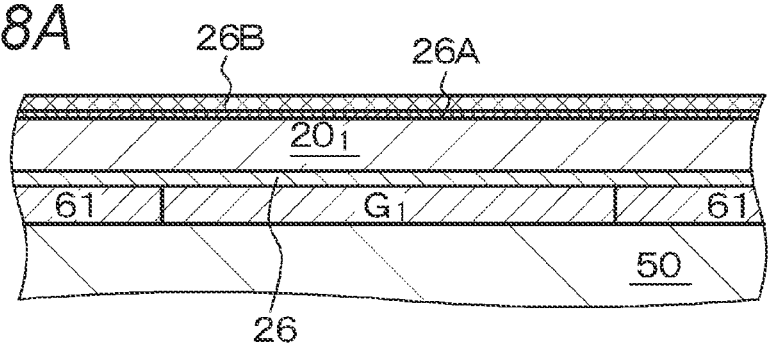
FIGS. 18A, 18B, and 18C are schematic partial end views of a base and the like following FIGS. 17A, 17B, and 17C, respectively for describing the method of manufacturing the semiconductor device according to the second embodiment.
Figure 18B:
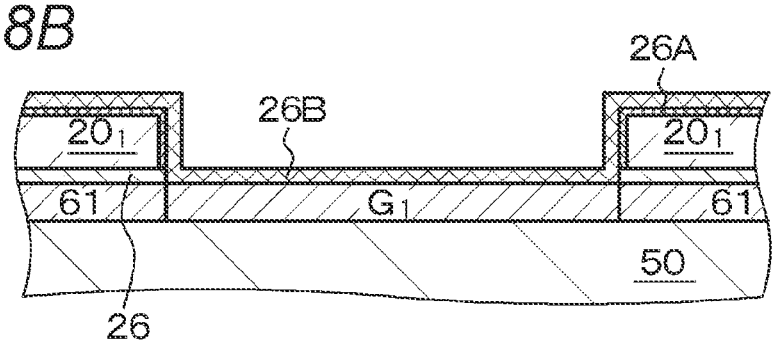
Figure 18C:
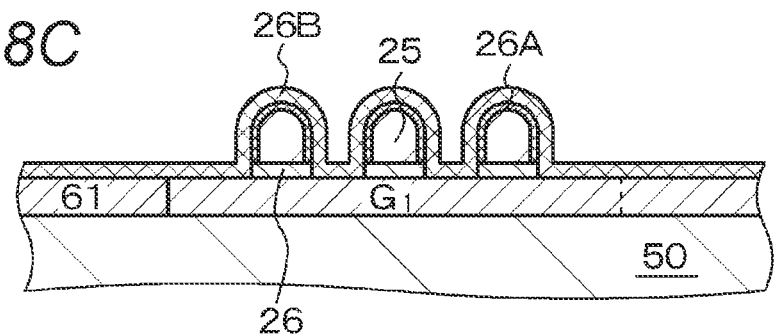
Figure 19A:
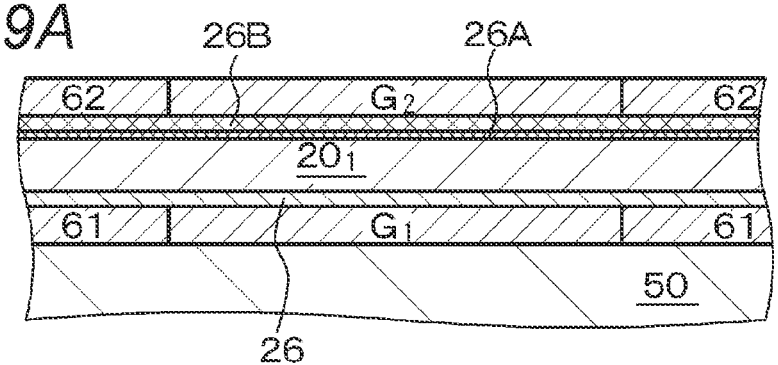
FIGS. 19A, 19B, and 19C are schematic partial end views of a base and the like following FIGS. 18A, 18B, and 18C, respectively for describing the method of manufacturing the semiconductor device according to the second embodiment.
Figure 19B:
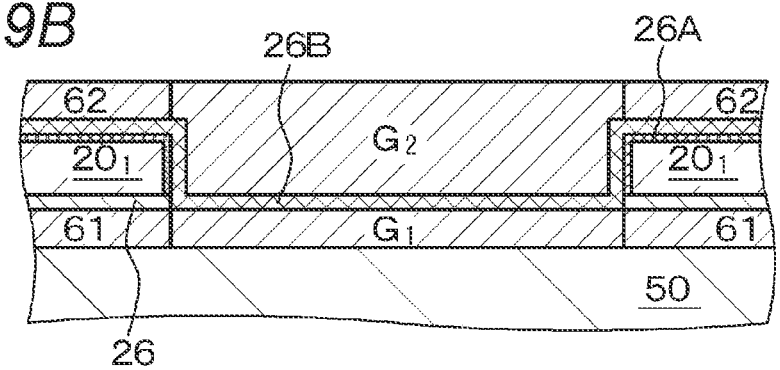
Figure 19C:
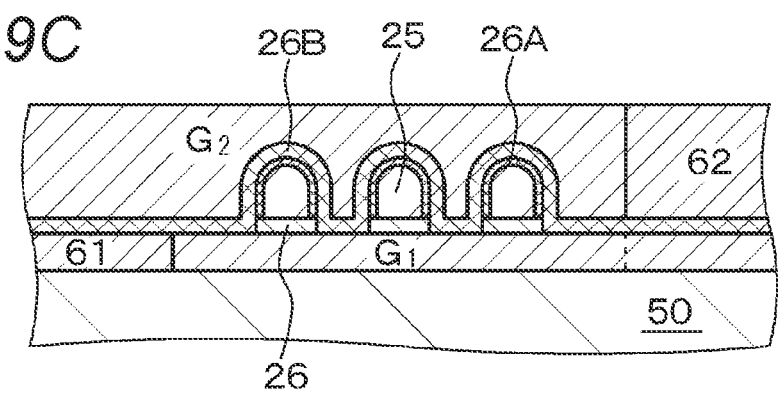

Subsequently, a portion 26A (including SiON) of the gate insulating film is formed by performing the thermal oxidation on the silicon layer $20_1$ having the nanowire structure (see FIGS. 17A, 17B, and 17C). The thermal oxidation allows the cross-sectional shape of the silicon layer $20_1$ having the nanowire structure to be substantially semicircular. Then, a remaining portion 26B of the gate insulating film including $HfO_2$ is formed on the portion 26A of the gate insulating film including SiON using the atomic layer deposition (ALD) (see FIGS. 18A, 18B, and 18C). Thus, a $1^{st}$ layer of the nanowire structure can be obtained.

[Process-230]

Subsequently, the gate electrode layer $G_2$ is formed in a region of the base 50 where an active region is to be formed, using sputtering, photolithography, and etching techniques. Then, the insulating material layer 62 is formed on the region from which the gate electrode layer $G_2$ is removed using CVD technique, and the insulating material layer 62 is flattened. Thus, the structures shown in FIGS. 19A, 19B, and 19C can be obtained. Moreover, the illustrations of [Process-240] to [Process-260] below are omitted.

[Process-240]

Then, a silicon layer $20_2$ on which the lower gate insulating film 26 is previously formed is provided on the gate electrode layer $G_2$ and the insulating material layer 62 using the smart cut method. Then, a $2^{nd}$ layer of the nanowire structure can be obtained by performing [Process-210] to [Process-230].

[Process-250]

Subsequently, the gate electrode layer $G_3$ is formed in a region of the base 50 where an active region is to be formed, using sputtering, photolithography, and etching techniques. Then, the insulating material layer 63 is formed on the region from which the gate electrode layer $G_3$ is removed using CVD technique, and the insulating material layer 63 is flattened.

[Process-260]

Then, the semiconductor device of the second embodiment can be obtained by performing processes similar to [Process-170] to [Process-190] of the first embodiment.

Although the present disclosure is described above on the basis of the preferred embodiments, the configuration and structure of the semiconductor device, the material forming the semiconductor device, and the method of manufacturing the semiconductor device described in the embodiments are merely examples and can be appropriately modified. In addition, the order of the processes in the method of manufacturing the semiconductor device according to the embodiments can be appropriately modified as desired. In the embodiments, the description is given solely on the basis of the channel structure portion having the nanosheet structure, but the channel structure portion can be the nanowire structure. Further, in the first embodiment, the re-channel semiconductor device is used, but a p-channel semiconductor device can be used. In this case, the material forming the semiconductor device is only required to be appropriately modified. An SOI substrate can be used as the base instead of the silicon semiconductor substrate. In the embodiments, although the stacked structure is described in which two channel formation region layers and three gate electrode layers are alternately stacked, the stacked structure is not limited to such a structure. A structure can be employed in which the channel formation region layers having (N−1) layers (where N=3, 4, 5, . . . ) and the N gate electrode layers are alternately stacked. The second wiring can be provided for each semiconductor device, or can be provided for each of a plurality of semiconductor devices. In other words, the second wiring can be shared by a plurality of semiconductor devices. Such a structure makes it possible for the heat dissipation area to be further increased and for the dissipation of the heat by the second wiring to be further increased, resulting in reducing the self-heating effect.

The embodiments describe that the odd-numbered gate electrode layer (the first gate electrode layer) is connected to the first wiring and the even-numbered gate electrode layer (the second gate electrode layer) is connected to the second wiring. On the other hand, it is possible to make a configuration in which the odd-numbered gate electrode layer (the first gate electrode layer) is connected to the second wiring, and the even-numbered gate electrode layer (the second gate electrode layer) is connected to the first wiring.

Figure 11A:
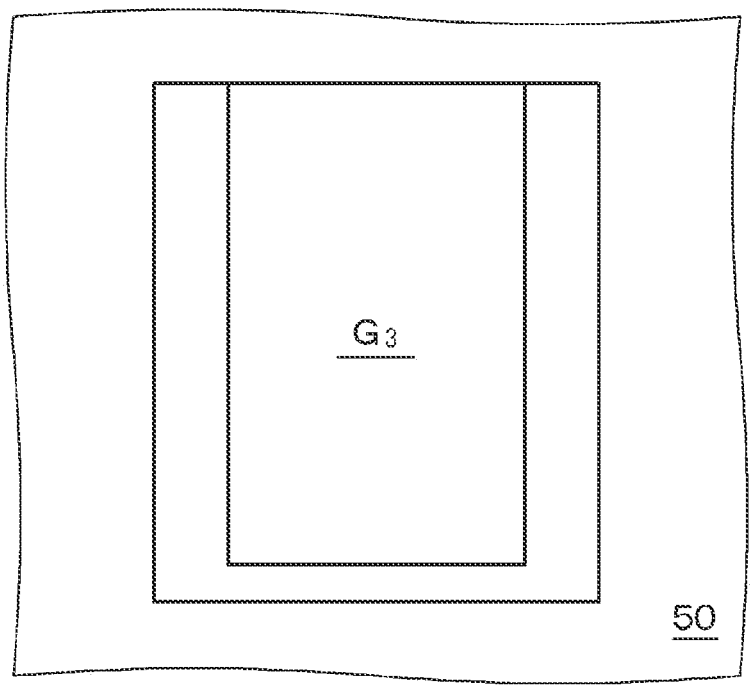
FIGS. 11A, 11B, and 11C are, following FIGS. 10A, 10B, and 10C, respectively, for describing a method of manufacturing the semiconductor device according to the first embodiment, respectively a schematic partial plan view of a base and the like, a similar schematic partial cross-sectional view taken along the arrow B-B in FIG. 1A, and a similar schematic partial cross-sectional view taken along the arrow C-C in FIG. 1A.
Figure 11B:
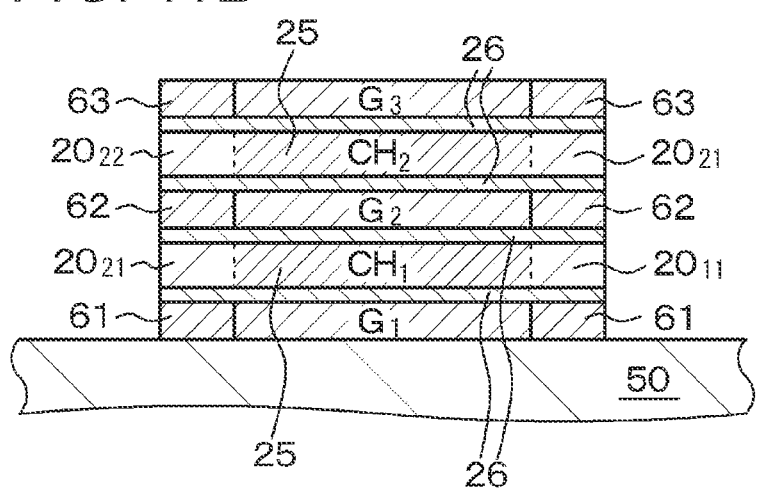
Figure 11C:
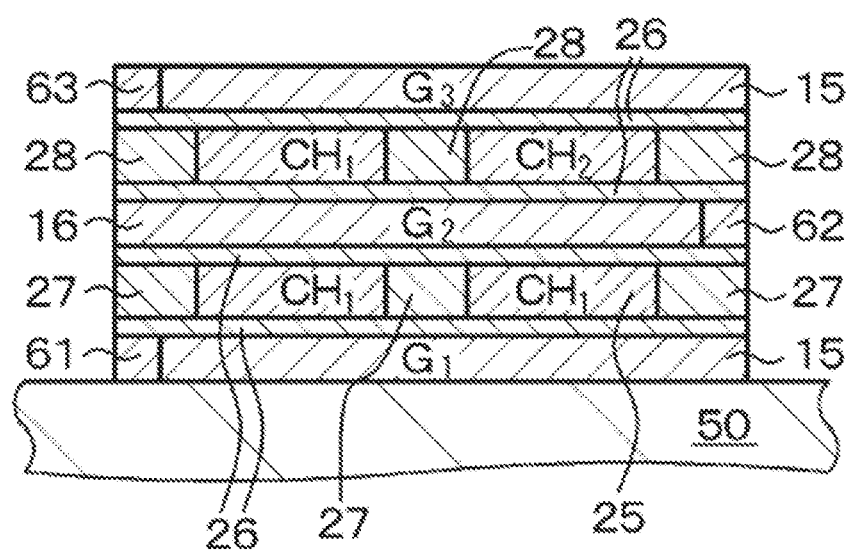
Figure 12A:
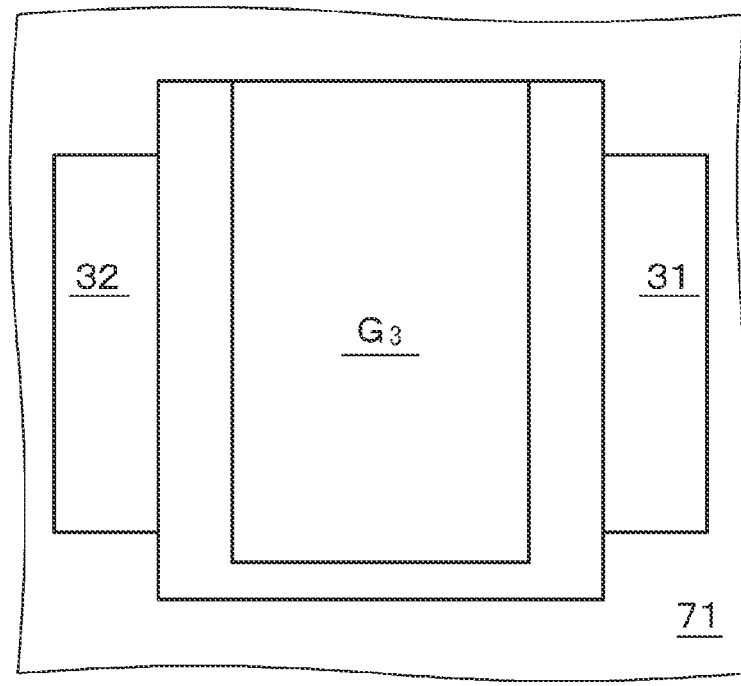
FIGS. 12A, 12B, and 12C are, following FIGS. 11A, 11B, and 11C, respectively, for describing a method of manufacturing the semiconductor device according to the first embodiment, respectively a schematic partial plan view of a base and the like, a similar schematic partial cross-sectional view taken along the arrow B-B in FIG. 1A, and a similar schematic partial cross-sectional view taken along the arrow C-C in FIG. 1A.
Figure 12B:
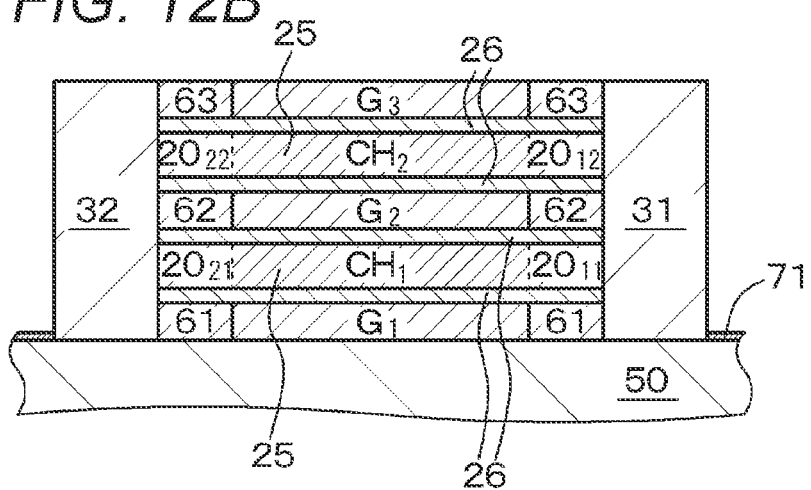
Figure 12C:
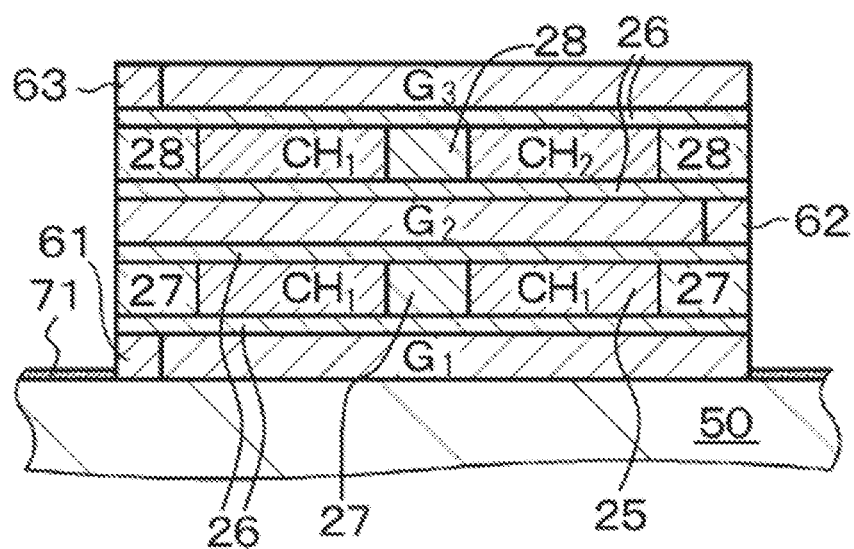
Figure 13A:
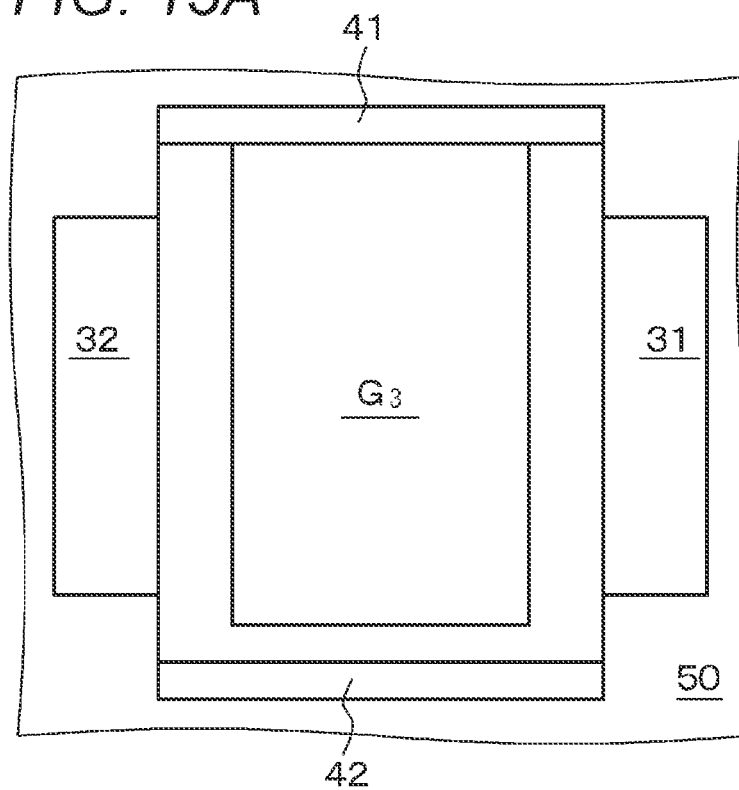
FIGS. 13A, 13B, and 13C are, following FIGS. 12A, 12B, and 12C, respectively, for describing a method of manufacturing the semiconductor device according to the first embodiment, respectively a schematic partial plan view of a base and the like, a similar schematic partial cross-sectional view taken along the arrow B-B in FIG. 1A, and a similar schematic partial cross-sectional view taken along the arrow C-C in FIG. 1A.
Figure 13B:
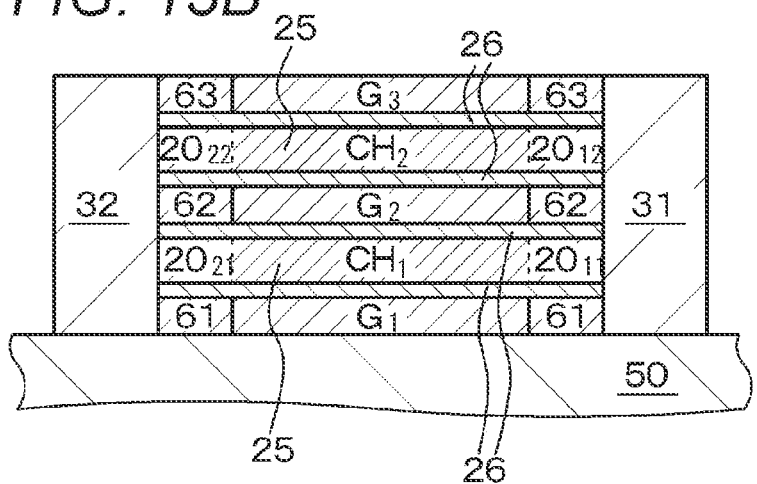
Figure 13C:
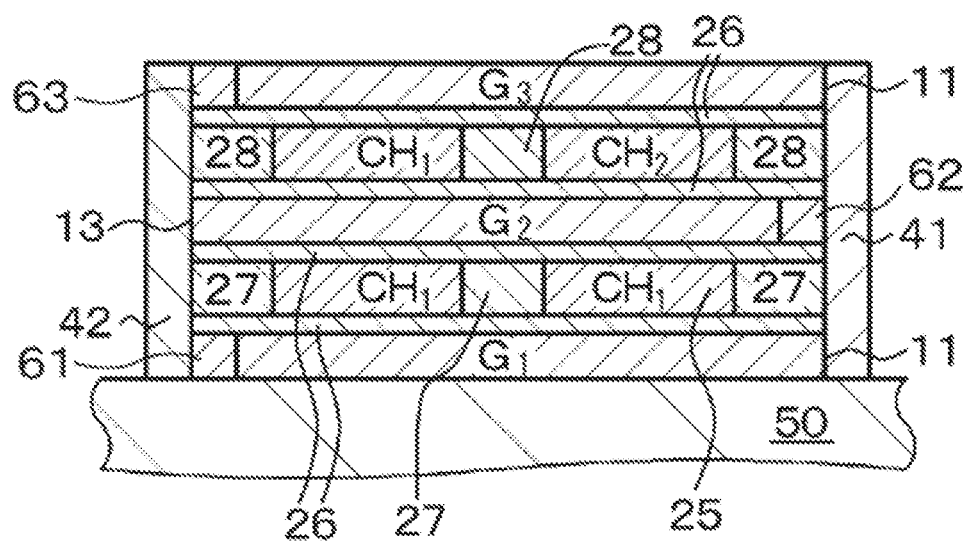

Further, in [Process-170], after obtaining the structures shown in FIGS. 11A, 11B, and 11C, through-holes can be formed in the insulating material layer 63, the extensions $20_{21}$ and $20_{22}$ of the channel structure portion 25, the insulating material layer 62, and the extensions $20_{11}$ and $20_{12}$ of the channel structure portion 25. Then, the through-holes can be filled with a conductive material. Thus, the source/drain regions 31 and 32 can be formed.

Note that the present disclosure may also include the following configuration.

[A01] «Semiconductor Device»

A semiconductor device including:
a stacked structure having a channel formation region layer and a gate electrode layer alternately arranged on top of each other on a base,
in which a lowermost layer of the stacked structure is formed with a $1^{st}$ layer of the gate electrode layers,
an uppermost layer of the stacked structure is formed with an $N^{th}$ (where N≥3) layer of the gate electrode layers,
the gate electrode layers each have a first end face, a second end face, a third end face opposing the first end face, and a fourth end face opposing the second end face,
the first end face of an odd-numbered layer of the gate electrode layers is connected to a first contact portion, and
the third end face of an even-numbered layer of the gate electrode layers is connected to a second contact portion.

[A02] The semiconductor device according to [A01], in which the channel formation region layer includes a channel structure portion having a nanosheet structure or a nanowire structure.

[A03] The semiconductor device according to [A01] or [A02], in which the channel formation region layers each have a first end face adjacent to the first end face of the gate electrode layer, a second end face adjacent to the second end face of the gate electrode layer, a third end face adjacent to the third end face of the gate electrode layer, and a fourth end face adjacent to the fourth end face of the gate electrode layer,
the second end face of each of the channel formation region layers has a channel structure portion connected to one of source/drain regions common to the channel formation region layers, and
the fourth end face of each of the channel formation region layers has a channel structure portion connected to the other of the source/drain regions common to the channel formation region layers.

[A04] The semiconductor device according to [A03], in which the second end face of each of the gate electrode layers is opposed to one of the source/drain regions via a first insulating film, and
the fourth end face of each of the gate electrode layers is opposed to the other of the source/drain regions via a second insulating film.

[A05] The semiconductor device according to any one of [A01] to [A04], in which the third end face of the odd-numbered layer of the gate electrode layers, the first end face of the even-numbered layer of the gate electrode layers, and the first and third end faces of each of the channel formation region layers are covered with an insulating material layer.

[A06] The semiconductor device according to any one of [A01] to [A05], in which the first end face of the odd-numbered layer of the gate electrode layers protrudes from a first end face of the channel formation region layer, and
the third end face of the even-numbered layer of the gate electrode layers protrudes from a third end face of the channel formation region layer.

[A07] The semiconductor device according to any one of [A01] to [A06], in which one of the first contact portion and the second contact portion is connected to a first wiring and the other is connected to a second wiring.

REFERENCE SIGNS LIST

11, 12, 13, 14 End face of gate electrode layer
15, 16 Protruding portion from end face of gate electrode layer
$20_1$, $20_2$ Silicon layer
$20_{11}$, $20_{12}$, $20_{21}$, $20_{22}$ Extension of channel formation region layer
21, 22, 23, 24 End face of channel formation region layer
25 Channel structure portion
26 Gate insulating film
26A Portion of gate insulating film
27, 28 Insulating layer 31, 32 Source/drain region
41 First contact portion
42 Second contact portion
50 Base
61, 62, 63 Insulating material layer
71 Mask layer
81 Etching resist layer
82 Resist layer
$CH_1$, $CH_2$ Channel formation region layer
$G_1$, $G_2$, $G_3$ Gate electrode layer

What is claimed is:

1. A semiconductor device, comprising:
   a stacked structure having a channel formation region layers and gate electrode layers alternately arranged on top of each other on a base,
   wherein a lowermost layer of the stacked structure is formed with a 1st layer of the gate electrode layers,
   wherein an uppermost layer of the stacked structure is formed with an $N^{th}$ (where N≥3) layer of the gate electrode layers, and
   wherein each channel formation region layer includes at least one channel structure portion and each channel structure portion includes extensions provided on each end of the at least one channel structure portion.

2. The semiconductor device according to claim 1, wherein the at least one channel structure portion has a nanosheet structure or a nanowire structure.

3. The semiconductor device according to claim 1, wherein a second end face of each of the channel formation region layers has the at least one channel structure portion connected to one of source/drain regions common to the channel formation region layers, and
   wherein a fourth end face of each of the channel formation region layers has the at least one channel structure portion connected to the other of the source/drain regions common to the channel formation region layers.

4. The semiconductor device according to claim 3, wherein a second end face of each of the gate electrode layers is opposed to one of the source/drain regions via a first insulating film, and
   wherein a fourth end face of each of the gate electrode layers is opposed to the other of the source/drain regions via a second insulating film.

5. The semiconductor device according to claim 1, wherein the at least one channel structure portion includes two channel structure portions.

6. The semiconductor device according to claim 5, wherein the at least one channel structure portion has a nanosheet structure.

7. The semiconductor device according to claim 1, wherein the at least one channel structure portion includes three channel structure portions.

8. The semiconductor device according to claim 7, wherein the at least one channel structure portion has a nanowire structure.

9. The semiconductor device according to claim 1, wherein a first end face of an odd-numbered layer of the gate electrode layers protrudes from a first end face of the channel formation region layers, and
   wherein a third end face of an even-numbered layer of the gate electrode layers protrudes from a third end face of the channel formation region layers.

10. The semiconductor device according to claim 1, wherein a High-k material insulating film is provided between each of the channel formation region layers and the gate electrode layers.

11. The semiconductor device according to claim 4, wherein a High-k material insulating film is provided between each of the channel formation region layers and the gate electrode layers and extends across the first and second insulating films.

12. The semiconductor device according to claim 10, wherein the High-k material insulating film extends across the extensions.

13. The semiconductor device according to claim 1, wherein the at least one channel structure portion includes Si, SiGe, Ge or InGaAs.

14. The semiconductor device according to claim 1, wherein each of the gate electrode layers includes TiN, TaN, Al, or W.

15. The semiconductor device according to claim 2, wherein both ends of a wire of the nanowire structure has a diameter of 5 nm to 10 nm.

* * * * *